(12) United States Patent
Goyal

(10) Patent No.: US 8,795,854 B2
(45) Date of Patent: *Aug. 5, 2014

(54) SEMICONDUCTOR-BASED, LARGE-AREA, FLEXIBLE, ELECTRONIC DEVICES ON {110}<100> ORIENTED SUBSTRATES

(76) Inventor: Amit Goyal, Knoxville, TN (US)

( * ) Notice: Subject to any disclaimer, the term of this patent is extended or adjusted under 35 U.S.C. 154(b) by 630 days.

This patent is subject to a terminal disclaimer.

(21) Appl. No.: 12/079,068

(22) Filed: Mar. 25, 2008

(65) Prior Publication Data

US 2008/0265255 A1    Oct. 30, 2008

Related U.S. Application Data

(63) Continuation-in-part of application No. 11/498,120, filed on Aug. 3, 2006, now Pat. No. 8,119,571, and a continuation-in-part of application No. 11/715,047, filed on Mar. 8, 2007, now Pat. No. 7,906,229.

(60) Provisional application No. 60/704,264, filed on Aug. 1, 2005.

(51) Int. Cl.
| H01L 31/09 | (2006.01) |
| H01L 29/04 | (2006.01) |
| B32B 9/00 | (2006.01) |
| B32B 15/04 | (2006.01) |
| H01L 31/0392 | (2006.01) |
| H01L 31/036 | (2006.01) |
| H01L 21/02 | (2006.01) |
| H01L 31/0687 | (2012.01) |
| B82Y 10/00 | (2011.01) |
| H01L 31/18 | (2006.01) |
| H01L 29/786 | (2006.01) |

(52) U.S. Cl.
CPC ...... *H01L 21/02425* (2013.01); *H01L 31/0392* (2013.01); *H01L 31/036* (2013.01); *H01L 21/0251* (2013.01); *H01L 21/02439* (2013.01); *H01L 21/02524* (2013.01); *Y02E 10/544* (2013.01); *H01L 21/02491* (2013.01); *H01L 29/7869* (2013.01); *H01L 21/02538* (2013.01); *H01L 21/02488* (2013.01); *H01L 31/0687* (2013.01); *H01L 21/02433* (2013.01); *H01L 21/02521* (2013.01); *H01L 29/78681* (2013.01); *B82Y 10/00* (2013.01); *H01L 31/1872* (2013.01); *H01L 29/78603* (2013.01)
USPC .......... 428/698; 428/699; 428/701; 428/446; 428/450; 428/472; 505/191; 257/64

(58) Field of Classification Search
USPC ................. 428/697–702, 457, 428; 505/230, 505/235–239, 191; 427/62, 126.3, 327, 427/402; 257/613–614
See application file for complete search history.

(56) References Cited

U.S. PATENT DOCUMENTS

| 6,512,171 B2 | 1/2003 | Inamasu et al. |
| 6,555,256 B1 * | 4/2003 | Christen et al. ............... 428/697 |
| 7,087,113 B2 | 8/2006 | Goyal |
| 7,906,229 B2 * | 3/2011 | Goyal ......................... 428/698 |
| 2002/0005084 A1 * | 1/2002 | Goyal et al. ..................... 75/228 |

(Continued)

*Primary Examiner* — Stanley Silverman
*Assistant Examiner* — Kallambella Vijayakumar

(57) ABSTRACT

Novel articles and methods to fabricate the same resulting in flexible, oriented, semiconductor-based, electronic devices on {110}<100> textured substrates are disclosed. Potential applications of resulting articles are in areas of photovoltaic devices, flat-panel displays, thermophotovoltaic devices, ferroelectric devices, light emitting diode devices, computer hard disc drive devices, magnetoresistance based devices, photoluminescence based devices, non-volatile memory devices, dielectric devices, thermoelectric devices and quantum dot laser devices.

38 Claims, 28 Drawing Sheets

(56) References Cited

U.S. PATENT DOCUMENTS

| | | |
|---|---|---|
| 2003/0015728 A1 | 1/2003 | Bosco et al. |
| 2004/0003768 A1* | 1/2004 | Goyal ............................. 117/2 |
| 2004/0121191 A1* | 6/2004 | Paranthaman et al. ....... 428/697 |
| 2005/0159298 A1* | 7/2005 | Rupich et al. ................. 502/100 |
| 2006/0115964 A1* | 6/2006 | Findikoglu et al. ........... 438/509 |
| 2006/0208257 A1* | 9/2006 | Branz et al. ..................... 257/49 |
| 2007/0044832 A1* | 3/2007 | Fritzemeier ................... 136/252 |

* cited by examiner

| Epitaxial semiconductor – single Or multiple layers |
|---|
| Flexible, crystalline, {110}<100>, metal or alloy substrate |

(B)

| Epitaxial semiconductor – single Or multiple layers |
|---|
| Single or multiple epitaxial buffer layers |
| Flexible, crystalline, {110}<100>, metal or alloy substrate |

(C)

| Epitaxial semiconductor – single Or multiple layers |
|---|
| Epitaxial, semiconductor template - single or multiple layers |
| Single or multiple epitaxial buffer layers |
| Flexible, crystalline, {110}<100>, metal or alloy substrate |

(D)

| Over layers such as a contact layer or a protective layer |
|---|
| Epitaxial semiconductor – single Or multiple layers |
| Epitaxial, semiconductor template - single or multiple layers |
| Single or multiple epitaxial buffer layers |
| Flexible, crystalline, {110}<100>, metal or alloy substrate |

FIG. 4

| Epitaxial semiconductor device layer(s) – single or multiple, selected from a group comprising of but not limited to those based on indirect bandgap, direct bandgap and multibandgap semiconductors |
|---|
| Optional, epitaxial semiconductor template layer or a graded semiconductor template layer to provide improved lattice matching to device layer |
| Optional, single or multiple buffer layers with atleast the top buffer having a {110}<100> or a 45° rotated, {110}<100> texture |
| Flexible, crystalline, metal or alloy substrate with a primary or secondary recrystallization texture of {110}<100> |

FIG. 5

| Epitaxial semiconductor device layer(s) – single or multiple, selected from a group comprising of but not limited to those based on indirect bandgap, direct bandgap and multibandgap semiconductors |
|---|
| Optional, epitaxial semiconductor template layer or a graded semiconductor template layer to provide improved lattice matching to device layer |
| Optional, single or multiple buffer layers with atleast the top buffer having a {100}<100> or a 45° rotated, {100}<100> texture |
| Flexible, crystalline, metal or alloy substrate with a primary or secondary recrystallization texture of {110}<100> |

FIG. 8
(A)
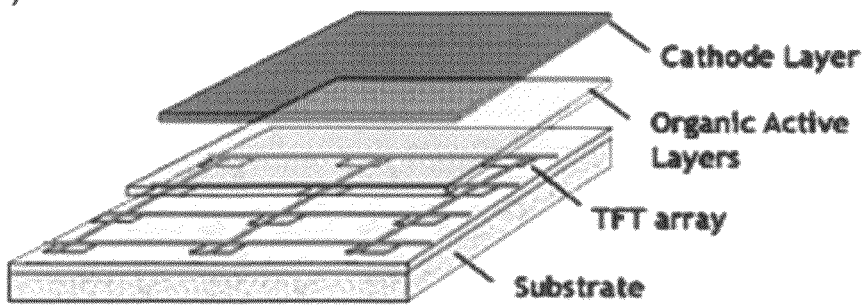
(B)
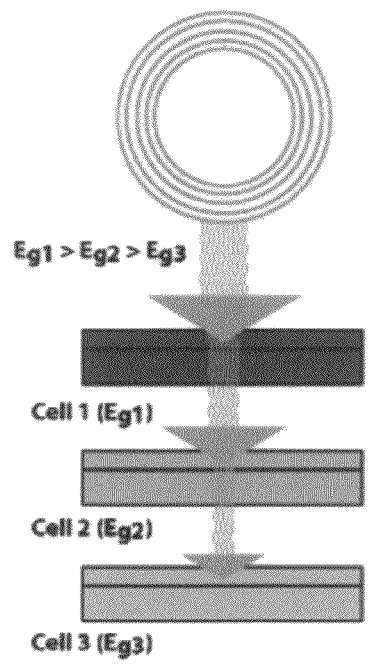

(A) 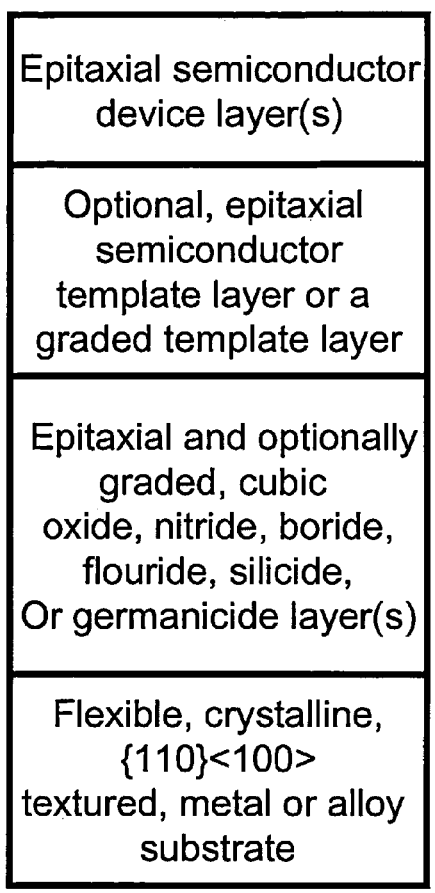 (B) 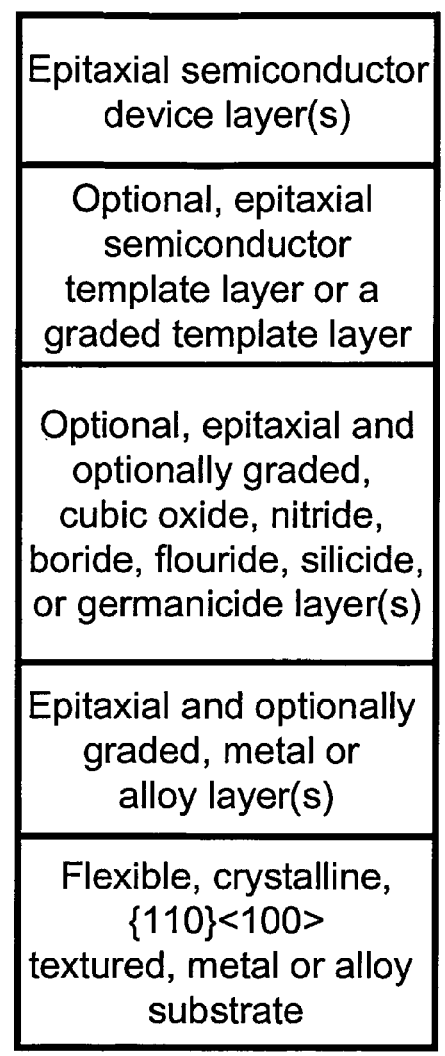
FIG. 15

{110}<100> textured Fe-3%Si substrate

FIG. 17
A. Fe-3%Si (200) Pole Figure
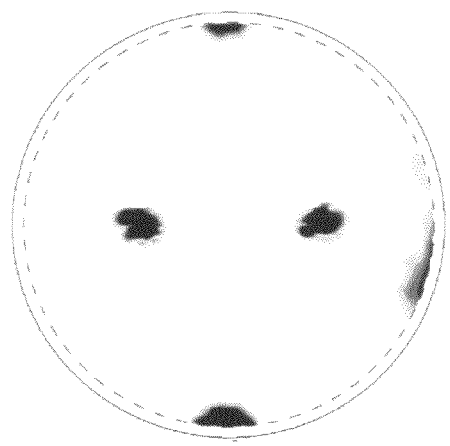
B. Fe-3%Si (110) Pole Figure
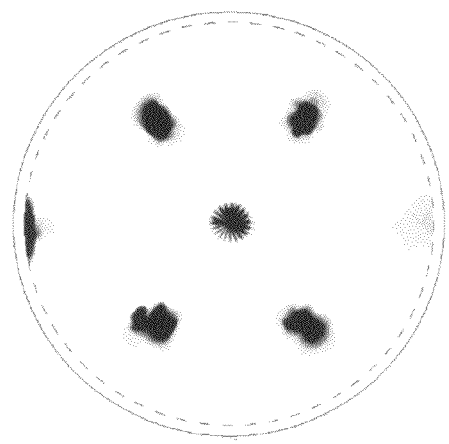

FIG. 18
A. NiW(111) Pole Figure
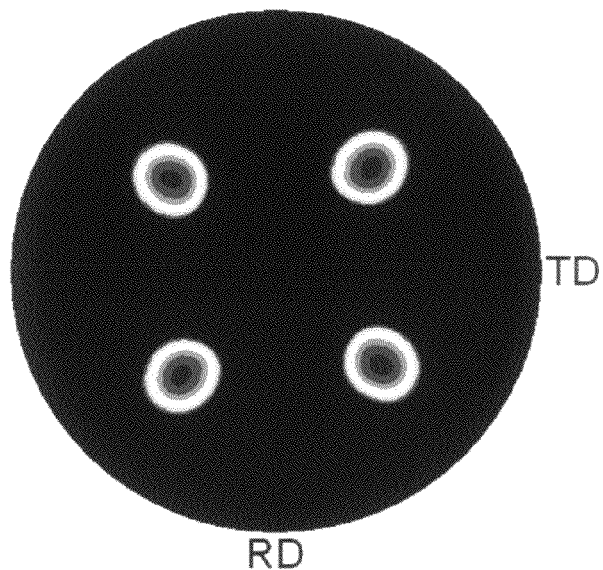
B. Mo(100) Pole Figure
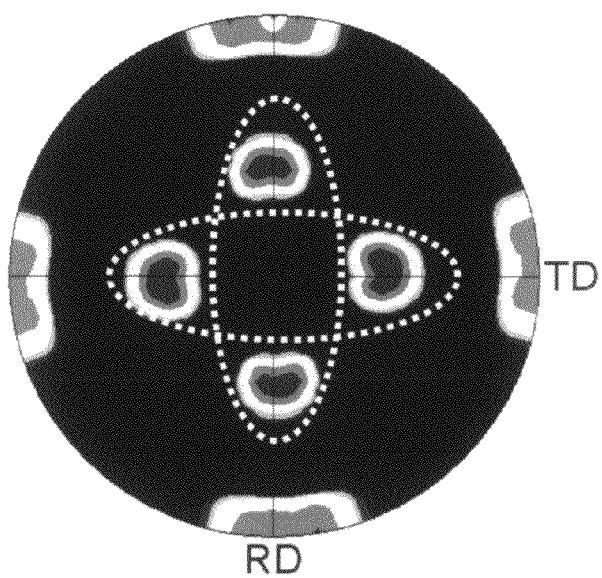

FIG. 20
(A) NiW (111) Pole Figure
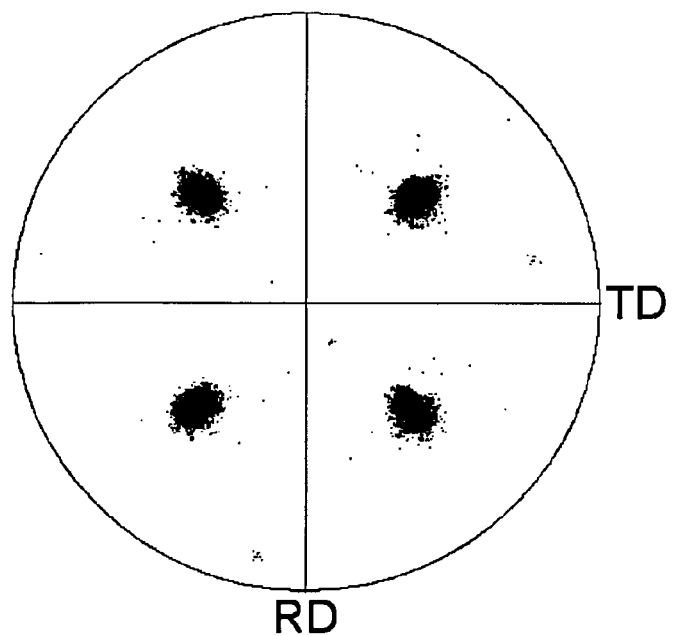
(B) Mo (100) Pole Figure
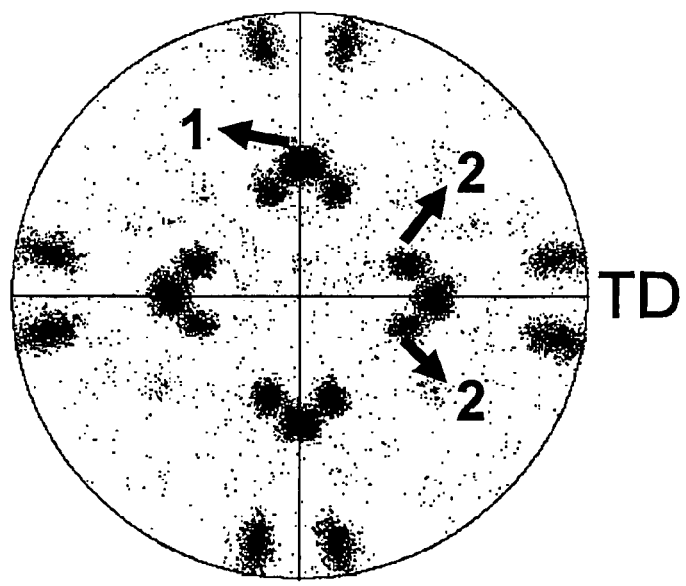

FIG. 21
(A) Fe-3%Si (100) Pole Figure
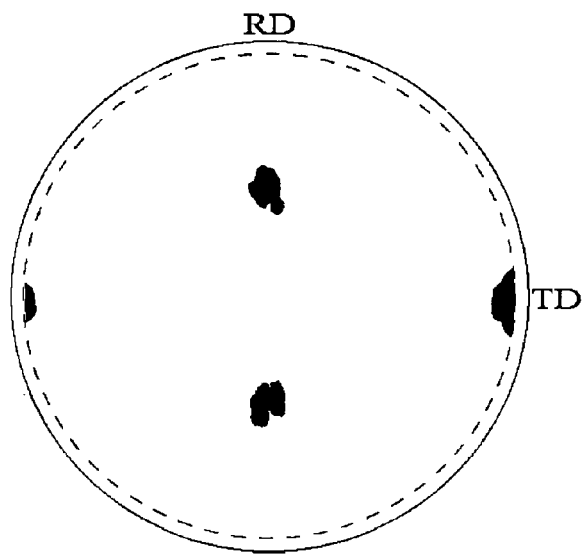
(B) Mo (100) Pole Figure
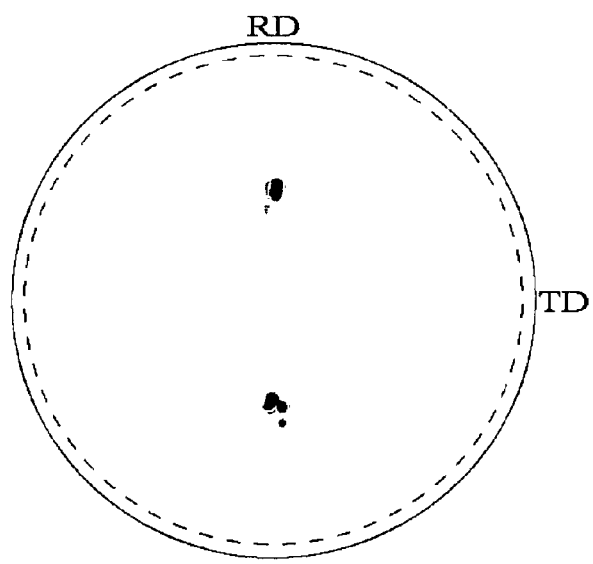

FIG. 24
(A)
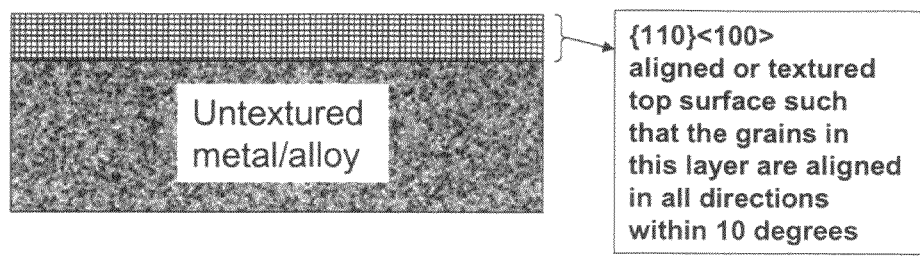
{110}<100> aligned or textured top surface such that the grains in this layer are aligned in all directions within 10 degrees
(B)
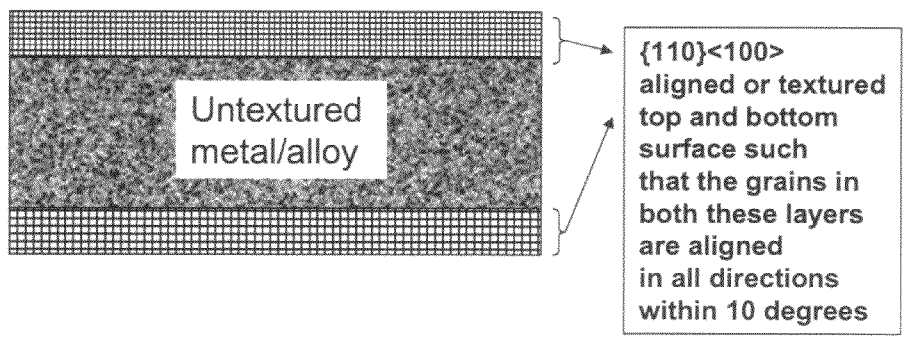
{110}<100> aligned or textured top and bottom surface such that the grains in both these layers are aligned in all directions within 10 degrees

SEMICONDUCTOR-BASED, LARGE-AREA, FLEXIBLE, ELECTRONIC DEVICES ON {110}<100> ORIENTED SUBSTRATES

CROSS-REFERENCE TO RELATED APPLICATIONS

This application is (1) a continuation-in-part of U.S. patent application Ser. No. 11/498,120, filed Aug. 3, 2006, now U.S. Pat. No. 8,119,571, which claimed priority to U.S. provisional patent application Ser. No. 60/704,264, both of which are herein incorporated by reference in entirety and (2) a continuation-in-part of U.S. patent application Ser. No. 11/715,047, filed Mar. 8, 2007, now U.S. Pat. No. 7,906,229, which is also herein incorporated by reference in its entirety.

STATEMENT REGARDING FEDERALLY FUNDED RESEARCH OR DEVELOPMENT

This invention was made with Government support under Contract No. DE-AC05-00OR22725 awarded by the United States Department of Energy. The Government has certain rights in this invention.

FIELD OF THE INVENTION

The invention relates to fabrication of high performance electronic devices comprising various types of semiconductors and articles made therefrom.

BACKGROUND OF THE INVENTION

Electronic devices based on semiconductors such as diodes, transistors and integrated circuits can be found everywhere. For many of these applications, if the cost of the device is significantly reduced, many more applications can be envisaged. This is especially true for the photovoltaic or solar energy application, for a whole range of sensors as well as for other application areas such as ferroelectric devices, light emitting diodes for solid state lighting applications, storage applications such as computer hard disc drives, magnetoresistance based devices, photoluminescence based devices, non-volatile memory applications, dielectric devices, thermoelectric devices, The use of renewable energy sources is essential for the future of the world we are living in. There is an unlimited potential for solar energy to power all the world's energy needs. However, for the past two decades, the promise of solar energy has remained unrealized. This is primarily because of the unfavorable price/performance metric of solar cells being manufactured today. Further technological innovations have the potential to cause the economic and commercial breakthrough necessary to lower prices to make solar energy cheaper than or equal to fossil fuels in cost.

Thin-film photovoltaics (PV) have a significant advantage over the traditional wafer-based crystalline Si cells. The primary advantage of thin films is cheaper materials and manufacturing costs and higher manufacturing yields compared to single-crystal technologies. Thin films use $\frac{1}{20}$ to $\frac{1}{100}$ of the material needed for crystalline Si PV and appear to be amenable to more automated, less expensive production. Currently, three film technologies are receiving significant interest from the industry for large scale PV: amorphous Si, $CuInSe_2$ and CdTe. In most cases, module efficiencies are closely related to cell efficiencies, with minor losses (~10%) due to some loss of active area and some electrical resistance losses. In order to further increase the efficiency and to be able to reproducibly fabricate thin-film based, high efficiency cells, microstructural features which limit the performance need to be controlled. While a complete understanding of the microstructural features which limit the performance are still unclear, it is reasonably well established that recombination at grain boundaries, intragrain defects and impurities is critical. In an effort to minimize the effect of grain boundaries, films with large grains or only low-energy GB's are an objective.

Most thin-film solar cells are based on polycrystalline device layers since the cost of single crystal substrates is prohibitively expensive. Because they are polycrystalline, they do not have a well-defined crystallographic orientation (both out-of-plane and in-plane). Crystallographic orientation can have two important effects. The first is the effect of orientation of the growth surface on incorporation of dopants, intrinsic defects, and other impurities. Previous studies on a wide variety of dopants have shown that variations of 1 to 2 orders of magnitude can occur based on crystallographic orientation. An extreme effect of anisotropic doping is Si doping in GaAs films. Si doping in GaAs films, causes n-type conduction on (111)B-type GaAs, but p-type on (111)A-type GaAs. The second effect of crystallographic orientation is a variation in growth rate of the film being deposited. Both experiments as well as simulations have shown that under certain conditions growth rates can vary by 1 to 2 orders of magnitude as a function of crystallographic orientation. Uncontrolled crystallographic orientation in PV materials with large grain sizes may therefore result in reproducibility problems and hence lower yields during high volume production. Of course, grain boundaries at the intersection of grains in the polycrystalline film act as detrimental, recombination centers.

Most of the microstructural features currently thought to be limiting polycrystalline, thin-film, solar cell performance can be avoided by growing epitaxial films on lattice-matched, single crystal substrates. However, the high costs of single crystal substrates, prohibits their use for realistic applications. The effect of grain boundaries can be circumvented in polycrystalline photovoltaic thin films if the grain sizes are large enough (grain size at which effects on properties are minimal depend among other things on the doping level). However, in thin-films, grain growth is typically restricted to only twice the thickness of the film. Hence, grain boundaries in polycrystalline films have a dominant effect on efficiencies. A large number of studies have reported the effects of grain boundaries on photovoltaic properties.

While much of the discussion above has focused on the solar cell application, there are numerous applications where a low cost, practically scalable method of fabricating single crystal-like semiconductor films is required where the effective size of the single crystal required is about a 100 μm or a few hundred microns in diameter. Furthermore, for certain applications, the semiconductor surfaces/films/wafers need to be flexible, thus enabling applications where a curved semiconductor may be desirable. For example, for a solar cell application it may be desirable to conform the PV module to the contour of a roof upon where it is placed. Thin-film transistors are used for fabricating displays. In this application one can also easily appreciate the use for flexible and large-area displays.

For electronic devices, an ordered array of three dimensional nanodots and nanorods promises to extend device physics to full two- or three-dimensional confinement (quantum wires and dots). Multidimensional confinement in these low dimensional structures has long been predicted to alter significantly the transport and optical properties, compared to bulk or planar heterostructures. More recently, the effect of charge quantization on transport in small semiconductor quantum dots has stimulated much research in single-electron devices, in which the transfer of a single electron is sufficient to control the device. The most important factor driving active research in quantum effect is the rapidly expanding semiconductor band-gap engineering capability provided by modern epitaxy. Possible applications include spin transistors and single electron transistors. Other possible applications of three dimensionally ordered nanodots and nanorods include potential applications in optoelectronics and sensors. For example, an array of luminescent ordered nanodots within a transparent matrix can be used for devices using the photoluminescence effect. Other applications include those in highly efficient photovoltaics, solid-state lighting devices, etc.

SUMMARY OF THE INVENTION

The invention relates to fabrication of large-area, flexible, semiconductor based electronic devices which have high performance. The invention results in semiconductor devices which are crystallographically textured.

"Flexible" as used herein refers to the ability to bend the device around a 12 inch mandrel without degradation of device electronic properties.

To achieve the foregoing and other articles, and in accordance with the purposes of the present invention, as embodied and broadly described herein, the present invention provides an electronic device article comprising (a) a flexible, large-grained, crystalline, annealed metal or alloy substrate with a secondary recrystallization texture of {110}<100>, with a sharpness characterized by a full-width-half-maximum (FWHM) of less than 10 degrees, and (b) at least one epitaxial layer of an electronic material on said buffer layer, selected from a group comprising of but not limited to those based on indirect bandgap semiconductors such as Si, Ge, GaP; direct bandgap semiconductors such as CdTe, CuInGaSe2 (CIGS), GaAs, AlGaAs, GaInP and AlInP; multiband semiconductors such as II-O-VI materials like $Zn_{1-y}Mn_yO_xTe_{1-x}$ and III-N-V multiband semiconductors such as $GaN_xAs_{1-x-y}P_y$, and combinations thereof. This includes minor dopants of other materials in the semiconductor layers for obtaining the required n-type or p-type semiconducting properties.

In a preferred embodiment of the present invention, the said semiconductor layer in the article is a compound semiconductor composed of elements from two or more different groups of the Periodic Table, including compounds of Group III (B, Al, Ga, In) and Group V (N, P, As, Sb, Bi) for the compounds AlN, AlP, AlAs, GaN, GaP, GaAs, InP, InAs, InSb, AlInGaP, AlGaAs, InGaN etc, and the compounds of Group II (Zn, Cd, Hg) and Group VI (O, S, Se, Te) such as ZnS, ZnSe, ZnTe, CdTe, HgTe, CdHgTe etc. In addition to binary compounds of the above, ternary (three elements, e.g. InGaAs) and quaternary (four elements, e.g. InGaAsP) compounds are also are included.

In a preferred embodiment of the present invention, the said semiconductor layer in the article comprises an elemental semiconductor or alloys of elements within the same group such as SiC and SiGe or a compound semiconductor comprising elements of group IB, IIIA and VIA of the periodic table such as alloys of copper, indium, gallium, aluminum, selenium and sulfur.

In a preferred embodiment of the present invention, the textured substrate has a grain size larger than 10 mm.

In a preferred embodiment of the present invention, the textured substrate has a out-of-plane texture characterized by a mosaic or FWHM of less than 5°.

In a preferred embodiment of the present invention, the said polycrystalline electronic device layer also has a crystallographic texture selected from a group comprising, {110}<100> texture, a rotated {110}<100> texture with a rotation angle less than 90°, a {100}<100> texture and a rotated {100}<100> texture with a rotation angle less than 90°.

The semiconductor device article in accordance with this invention can also include at least one buffer layer on said substrate selected from a group comprising a metal, an alloy, a nitride, boride, oxide, fluoride, carbide, silicide or combinations thereof.

In a preferred embodiment of the present invention, at least one epitaxial buffer layer is deposited below the semiconductor layer and said buffer layer has a crystallographic texture corresponding to {110}<100> or a rotated {110}<100> texture and with a mosaic or sharpness of texture of less than 10 degrees.

In a preferred embodiment of the present invention, the said buffer layer has a crystal structure selected from a group comprising of rock-salt crystal structures of formula AN or AO, where A is a metal and N and O correspond to nitrogen and oxygen; perovskite crystal structures of formula $ABO_3$, where A and B are metals and O is oxygen; pyrochlore crystal structures of formula $A_2B_2O_7$, where A and B are metals and O is oxygen and bixbyite crystal structures of formula $A_2O_3$, where A is a metal and O is oxygen.

In yet another preferred embodiment of the present invention, the buffer layer can be an oxide buffer layer selected from a group comprising gamma $Al_2O_3$ (cubic form of $Al_2O_3$); perovskites such as but not limited to $SrTiO_3$, (Sr, Nb)$TiO_3$, $BaTiO_3$, (Ba,Ca)$TiO_3$, $LaMnO_3$, $LaAlO_3$, doped perovskites such as (La,Sr)$MnO_3$, (La, Ca)$MnO_3$; layered perovskites such as $Bi_4Ti_3O_{12}$; pyrochlores such as but not limited to $La_2Zr_2O_7$, $Ca_2Zr_2O_7$, $Gd_2Zr_2O_7$; fluorites such as $Y_2O_3$, YSZ; rock-salt oxides such as but not limited to MgO; spinels such as but not limited to $MgAl_2O_4$, The buffer layer can be a silicide buffer layer or an intermetallic alloy with germanium corresponding to a layer with a chemical formula, MSi or $MSi_2$, $MSi_3$, MGe or $MGe_2$, $MGe_3$, wherein M is a metal such as but not limited to Ni, Cu, Fe, Ir, and Co.

In a preferred embodiment of the present invention, at least one buffer is present and said buffer layer corresponds to a metal or alloy layer selected from a group comprising Mo, Cr, Nb, W, V, Ta and their alloys.

In a preferred embodiment of the present invention, at least one buffer is present and said buffer layer corresponds to a metal or alloy buffer layer and has a crystal body centered cubic (BCC) structure.

In a preferred embodiment, at least the top buffer layer is electrically conducting.

In yet another preferred embodiment, the buffer layer can be a "graded buffer layer" comprising of multiple buffer layers with varying lattice parameters to provide a good lattice match to the semiconductor layer.

In a preferred embodiment, the electronic device further comprises a semiconductor template layer between the buffer layer(s) and the semiconductor device layer to provide a good lattice match to the semiconductor device layer.

The semiconductor template layer can be a "graded semiconductor template" layer with multiple layers of varying lattice parameters so, as to provide a good lattice match to the semiconductor device layer.

In a preferred embodiment, the substrate is selected from a group comprising Fe, Mo, Cr, W, Nb and their alloys thereof.

In a preferred embodiment, the substrate comprises an iron-silicon alloy.

In a preferred embodiment, the substrate has a crystal structure corresponding to body centered cubic (BCC).

In a preferred embodiment, the substrate is a multilayer composite substrate with top layer or surface having a crystallographic texture corresponding to {110}<100> with a mosaic of less than 10°.

In a preferred embodiment, the substrate is a multilayer composite substrate with the top and bottom layers having a crystallographic texture corresponding to {110}<100> with a mosaic of less than 10°.

In a preferred embodiment, the electronic device is a photovoltaic device comprising at least one pn junction parallel to the substrate surface.

In yet another preferred embodiment, the electronic device is a photovoltaic device comprising a multi-junction cell with at least two and preferably three pn junctions parallel to the substrate surface.

In a preferred embodiment, the photovoltaic conversion efficiency of said device layer is greater than 13% and preferably better than 15%.

In a preferred embodiment, the said electronic device layer consists of aligned nanodots of another crystalline composition than the device layer.

In yet another preferred embodiment, 80% of the nanodots are aligned within 60 degrees from the normal to the device layer.

The electronic device in accordance with this invention can be used for an application selected from a group comprising of photovoltaic devices, flat-panel displays, thermophotovoltaic devices, ferroelectric devices, light emitting diode devices, computer hard disc drive devices, magnetoresistance based devices, photoluminescence based devices, non-volatile memory devices, dielectric devices, thermoelectric devices and quantum dot laser devices.

In a preferred embodiment, the electronic device has an area larger than 50 in$^2$. In yet a further preferred embodiment, the electronic device has an area larger than 113 in$^2$.

In a preferred embodiment, the electronic device in accordance with this invention can comprise at least one device component selected from a group comprising of two terminal devices such as a diode; three terminal devices such as a transistor, thyristor or rectifier; and multi-terminal devices such as a microprocessor, random access memory, read-only-memory or a charge-coupled device.

BRIEF DESCRIPTION OF THE DRAWINGS

A fuller understanding of the present invention and the features and benefits thereof will be accomplished upon review of the following detailed description together with the accompanying drawings, in which:

FIG. 2 shows an idealized schematic representation in cross-section of various embodiments of multilayer structures in accordance with the present invention. FIG. 2A shows the most basic structure, namely a flexible metal or alloy substrate with a recrystallization texture of {110}<100> with an epitaxial semiconductor layer comprising of single or multiple layers. FIG. 2B a flexible metal or alloy substrate with a recrystallization texture of {110}<100> with single or multiple epitaxial buffer layers and with an epitaxial semiconductor comprising of single or multiple layers. FIG. 2C a flexible metal or alloy substrate with a recrystallization texture of {110}<100> with single or multiple epitaxial buffer layers, an epitaxial semiconductor template layer(s) and with an epitaxial semiconductor comprising of single or multiple layers. FIG. 2D a flexible metal or alloy substrate with a recrystallization texture of {110}<100> with single or multiple epitaxial buffer layers, an epitaxial semiconductor template layer(s), an epitaxial semiconductor comprising of single or multiple layers and an overlayer of a contact layer or a protective layer.

FIG. 3 shows a device comprising a flexible, crystalline, crystallographically textured, metal or alloy substrate with an optional, epitaxial, single or multiple buffer layers, an optional epitaxial, semiconductor template layer or a graded semiconductor template layer to provide improved lattice matching to device layer on top of the buffer layer(s); epitaxial p-type and n-type semiconductor layers on the top buffer layer or the optional semiconductor template layer, a transparent conductor layer and an antireflection coating with metal grid lines. One use of such a device as shown in FIG. 3 is for solar power generation.

FIG. 4 shows an idealized schematic representation in cross-section of embodiments of multilayer structures in accordance with the present invention. The figure shows a flexible, crystalline, metal or alloy substrate with a primary or secondary recrystallization texture of {110}<100>; optional, epitaxial, single or multiple buffer layers with at least the top buffer having a {110}<100> or a 45° rotated, {110}<100> texture; an optional, epitaxial semiconductor template layer or a graded semiconductor template layer to provide improved lattice matching to device layer on top of the buffer layer(s) and finally an epitaxial semiconductor device layer—single or multiple, selected from a group comprising of but not limited to those based on indirect bandgap, direct bandgap and multibandgap semiconductors.

FIG. 5 shows an idealized schematic representation in cross-section of embodiments of multilayer structures in accordance with the present invention. The figure shows a flexible, crystalline, metal or alloy substrate with a primary or secondary recrystallization texture of {110}<100>; optional, epitaxial, single or multiple buffer layers with at least the top buffer having a {100}<100> or a 45° rotated, {100}<100> texture; an optional, epitaxial semiconductor template layer or a graded semiconductor template layer to provide improved lattice matching to device layer on top of the buffer layer(s) and finally an epitaxial semiconductor device layer—single or multiple, selected from a group comprising of but not limited to those based on indirect bandgap, direct bandgap and multibandgap semiconductors.

FIG. 6 shows a device comprising a flexible, crystalline, metal or alloy substrate with a primary or secondary recrystallization texture of {110}<100>; optional, epitaxial, single or multiple buffer layers with at least the top buffer having a {110}<100> or a 45° rotated, {110}<100> texture; optional epitaxial, semiconductor template layer or a graded semiconductor template layer to provide improved lattice matching to device layer on top of the buffer layer(s); textured, epitaxial p-type and n-type semiconductor layers on the top buffer layer or the optional semiconductor template layer; a transparent conductor layer and an antireflection coating with metal grid lines. One use of such a device as shown in FIG. 6 is for solar power generation.

FIG. 7 shows a device comprising a flexible, crystalline, metal or alloy substrate with a primary or secondary recrystallization texture of {110}<100>; optional, epitaxial, single or multiple buffer layers with at least the top buffer having a {100}<100> or a 45° rotated, {100}<100> texture; optional epitaxial, semiconductor template layer or a graded semiconductor template layer to provide improved lattice matching to device layer on top of the buffer layer(s); textured, epitaxial p-type and n-type semiconductor layers on the top buffer layer or the optional semiconductor template layer; a transparent conductor layer and an antireflection coating with metal grid lines. One use of such a device as shown in FIG. 7 is for solar power generation.

FIG. 8A shows an idealized schematic of a simple active-matrix, organic light emitting diode (AMOLED). FIG. 8B shows an idealized schematic representation of a multijunction cell containing three cells in accordance with the present invention. In a typical multijunction cell, individual cells with different bandgaps are stacked on top of one another. The individual cells are stacked in such a way that sunlight falls first on the material having the largest bandgap. Photons not absorbed in the first cell are transmitted to the second cell, which then absorbs the higher-energy portion of the remaining solar radiation while remaining transparent to the lower-energy photons. These selective absorption processes continue through to the final cell, which has the smallest bandgap. In essence, a multijunction device is a stack of individual single-junction cells in descending order of bandgap (Eg). The top cell captures the high-energy photons and passes the rest of the photons on to be absorbed by lower-bandgap cells.

FIG. 9A shows a tri-junction cell of GaInP (Eg=eV)/GaAs (1.4 eV)/Ge (0.7 eV); FIG. 9B shows a tri-junction cell of GaInP (Eg=eV)/GaInAs (1.25 eV)/Ge (0.7 eV); and FIG. 9C shows a four-junction cell of GaInP (Eg=eV)/GaAs (1.4 eV)/GaInAs (1.25 eV)/Ge (0.7 eV).

FIG. 10 shows a device comprising a flexible, crystalline, metal or alloy substrate with a primary or secondary recrystallization texture of {110}<100>; optional, epitaxial single or multiple buffer layers; optional epitaxial, semiconductor template layer or a graded semiconductor template layer to provide improved lattice matching to device layer on top of the buffer layer(s); a textured, epitaxial bottom cell comprising a pn junction; a tunnel junction; a top cell comprising a pn junction; a transparent conductor layer; an antireflection coating and metal grid lines. One use of devices shown in FIG. 10 is for solar power generation.

FIG. 11 shows a device comprising a flexible, crystalline, metal or alloy substrate with a primary or secondary recrystallization texture of {110}<100>; optional, epitaxial single or multiple buffer layers; optional epitaxial, semiconductor template layer or a graded semiconductor template layer to provide improved lattice matching to device layer on top of the buffer layer(s); a textured, epitaxial bottom cell comprising a pn junction; a tunnel junction; a middle cell comprising a pn junction; a tunnel junction; a top cell comprising a pn junction; a transparent conductor layer; an antireflection coating and metal grid lines. One use of devices shown in FIG. 11 is for solar power generation.

FIG. 15 shows an idealized schematic representation in cross-section of various embodiments of multilayer structures in accordance with the present invention. FIG. 15A shows a flexible, crystalline, {110}<100> textured metal or alloy substrate; an epitaxial and optionally graded, cubic oxide, nitride, boride, fluoride, silicide or geraminicide buffer layer(s) on top of the substrate, an epitaxial semiconductor template layer or a graded template layer and an epitaxial semiconductor device layer(s). FIG. 15B shows a flexible, crystalline, {110}<100> textured metal or alloy substrate; an epitaxial and optionally graded metal or alloy layer(s), an epitaxial and optionally graded, cubic oxide, nitride, boride, fluoride, silicide or buffer layer(s) on top of the substrate, an epitaxial semiconductor template layer or a graded template layer and an epitaxial semiconductor device layer(s).

FIG. 17 shows the texture of the substrate shown in FIG. 16. FIG. 17A shows a (200) pole-figure and FIG. 17B shows a corresponding (110) pole figure. Only a single texture corresponding to the {110}<100> texture is present. This implies that the {110} plane is parallel to the surface of the substrate and the [100] direction is aligned in the plane of the substrate as well. The texture shown in this figure is indicative of a essentially a large, single crystal with a mosaic.

FIG. 18A shows a (111) pole figure for a cube-textured, {100}<100> oriented, face centered cubic (FCC) NiW substrate. The four peaks are crystallographically equivalent and each corresponds to the {100}<100> orientation. FIG. 18B shows a (100) pole figure for a Mo film grown epitaxially on the {100}<100> textured NiW substrate. Here the inner peaks correspond to the (110) plane or orientation of the body centered cubic (BCC) Mo layer. So the (110) plane in the Mo layer is parallel to the (100) plane of the NiW substrate. The (110) plane has a two fold-symmetry and only a pair of inner peaks in the pole figure correspond to one orientation as indicated by the dotted white ellipse. The pole figure shows two white ellipses indicating that there are two epitaxial orientations of Mo on the NiW, which are rotated by 90 degrees. This is should result in numerous high-angle grain boundaries everywhere in the Mo layer.

FIG. 20 shows the general epitaxy obtained for BCC metals and alloys on FCC metals and alloys. FIG. 20A shows a (100) pole figure for a cube-textured, {110}<100> NiW substrate. Upon deposition of a Mo, Cr, W, Nb or another BCC metal or alloy the range of epitaxial orientations that can be obtained are shown in FIG. 20B. In addition to the two 90 degree rotated orientations shown in FIG. 18B, marked by "1" in FIG. 20B, there are two satellite peaks, labeled "2" around each of the four peaks corresponding to the peaks marked by "1". These satellite peaks create additional, high-angle grain boundaries in the BCC layer growth epitaxially on the FCC substrate.

FIG. 21A shows a (100) pole figure for a {110}<100> textured Fe-3% Si alloy substrate. The pole figure shows a clean, single orientation texture. FIG. 21B shows (100) pole figure for a Mo layer deposited epitaxially on the Fe-3% Si alloy. Only a single orientation, near-perfect epitaxy is obtained.

FIG. 24A shows an idealized schematic representation in cross-section of a composite substrate which contains a crystallographically untextured or unaligned bottom with a top surface which is {110}<100> textured or aligned such that the all the grains in this layer are aligned in all directions within 10 degrees. FIG. 24B shows an idealized schematic representation in cross-section of a composite substrate which contains a crystallographically untextured or unaligned center with a top and bottom surface which is {110}<100> textured or aligned such that all the grains in this layer are aligned in all directions within 10 degrees.

DETAILED DESCRIPTION OF THE PREFERRED EMBODIMENTS

The invention relates to fabrication of large-area, flexible, crystallographically textured, semiconductor based electronic devices which have high performance. The invention also enables continuous fabrication of such devices using reel-to-reel deposition.

Figure 1:
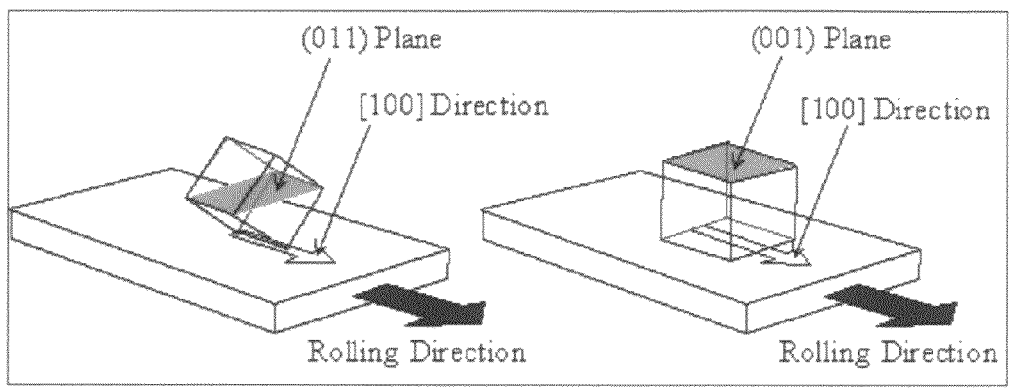
FIG. 1 shows an idealized schematic representation of the texture of interest in this invention. Two kinds of textures are shown—{110}<100> and a {110}<100> texture. In both the textures, the [100] direction is parallel to the former rolling direction. In one case however, the {110} plane is parallel to the surface of the tape and in the other the {100} plane is parallel to the surface of the tape.

FIG. 1 shows an idealized schematic representation of the texture of interest in this invention. Two kinds of textures are shown—{110}<100> and a {110}<100> texture. In both the textures, the [100] direction is parallel to the former rolling direction. In one case however, the {110} plane is parallel to the surface of the tape and in the other the {100} plane is parallel to the surface of the tape.

A {110}<100> textured semiconductor is useful for achieving high device performance. One particular advantage of the {110}<100> texture, is that it can be formed in materials using secondary recrystallization and this results in very large grain sizes. These triaxially-textured metal or alloy templates can be fabricated by thermomechanical processing techniques such as rolling and annealing, pressing or stamping and annealing, forging and annealing, drawing and annealing and swaging and annealing. For all thermomechanical processing routes, the crystallographic texture we are referring to in this invention or patent application is the annealing or recrystallization texture and not the deformation texture. "Deformation texture" is the crystallographic texture which develops in metals and alloys upon mechanical deformation and the process of deformation results in plastically deformed grains. Deformation texture can also be quite sharp and biaxial and has certain specific orientations in cubic materials. Details about typical deformation textures in metals and alloys that can be produced by mechanical deformation can be found in the text books—"Structure of Metals" by Charles Barrett and T. B. Massalski, $3^{rd}$ edition, Pergamon Press, 1980, pages 541-566; "Recrystallisation and related annealing phenomena" by F J Humphreys, M Hatherly, published by Elsevier in 2004, pages 43-54. Recrystallization is a process by which deformed grains are replaced by a new set of undeformed grains that nucleate and grow until the original grains have been entirely consumed. A detailed definition of recrystallization can be obtained from literature in the field or from the online free encyclopedia, Wikipedia's website— http://en.wikiPedia.org/wiki/Recrystallization_(metallurgy). The crystallographic texture upon the process of recrystallization is referred to as recrystallization texture. Details about how annealing or recrystallization texture can be produced by thermomechanical processing can be found in book titled "Recrystallisation and related annealing phenomena" by FJ Humphreys, M Hatherly, published by Elsevier in 2004, pages 327-415; "Structure of Metals" by Charles Barrett and T. B. Massalski, $3^{rd}$ edition, Pergamon Press, 1980, pages 568-582; All references indicated in the book are also included as relevant references. Details of how to develop a sharp, {110}<100> texture, using secondary recrystallization can be found in the book. In particular, details of how to develop a sharp, {110}<100> recrystallization textures in cubic, body-centered metals and alloys is discussed in detail in the book. In this invention, crystallographically textured, and fully recrystallized metals and alloys are of specific interest. This is because the surface of as-rolled and textured metals and alloys is not readily amenable for epitaxial growth of other materials. Moreover, deformation textures in general, do not have the desired crystallographic orientations for integration with semiconductors via suitable buffer layers. Buffer layer(s) are used to provide a chemical barrier and a structural template on which to grow the semiconductor layer(s). A chemical barrier is needed to prevent diffusion of elements from the metal/alloy or ceramic substrate to the semiconductor layer(s). A structural template providing a good lattice match to the desired device layer is also important.

FIG. 2 shows an idealized schematic representation in cross-section of various basic embodiments of multilayer structures in accordance with the present invention. FIG. 2A shows the most basic structure, namely a flexible metal or alloy substrate with a recrystallization texture of {110}<100> with an epitaxial semiconductor layer comprising of single or multiple layers. FIG. 2B a flexible metal or alloy substrate with a recrystallization texture of {110}<100> with single or multiple epitaxial buffer layers and with an epitaxial semiconductor comprising of single or multiple layers. FIG. 2C a flexible metal or alloy substrate with a recrystallization texture of {110}<100> with single or multiple epitaxial buffer layers, an epitaxial semiconductor template layer(s) and with an epitaxial semiconductor comprising of single or multiple layers. FIG. 2D a flexible metal or alloy substrate with a recrystallization texture of {110}<100> with single or multiple epitaxial buffer layers, an epitaxial semiconductor template layer(s), an epitaxial semiconductor comprising of single or multiple layers and an overlayer of a contact layer or a protective layer. As mentioned previously, the purpose of the buffer layers is to transfer the crystallographic orientation from the metal or alloy substrate to the electronic device layer and to act as a chemical barrier and as a structural template to grow the device layer on.

The said epitaxial semiconductor device layer in FIG. 2 can be selected from a group comprising of but not limited to those based on indirect bandgap semiconductors such as Si, Ge, GaP; direct bandgap semiconductors such as CdTe, CuInGaSe$_2$ (CIGS), GaAs, AlGaAs, GaInP and AlInP; multiband semiconductors such as II-O-VI materials like $Zn_{1-y}Mn_yO_xTe_{1-x}$ and III-N-V multiband semiconductors such as $GaN_xAs_{1-x-y}P_y$, and combinations thereof. This includes minor dopants of other materials in the semiconductor layers for obtaining the required n-type or p-type semiconducting properties. Definitions of a "direct", "indirect" and "multiband" semiconductor can be obtained from literature in the field or from the online free encyclopedia, Wikipedia (http://en.wikipedia.org/wiki/Main_Page).

In a preferred embodiment of the present invention, the said semiconductor layer in the article can be a compound semiconductor composed of elements from two or more different groups of the Periodic Table, including compounds of Group III (B, Al, Ga, In) and Group V (N, P, As, Sb, Bi) for the compounds AlN, AlP, AlAs, GaN, GaP, GaAs, InP, InAs, InSb, AlInGaP, AlGaAs, InGaN etc, and the compounds of Group II (Zn, Cd, Hg) and Group VI (O, S, Se, Te) such as ZnS, ZnSe, ZnTe, CdTe, HgTe, CdHgTe etc. In addition to binary compounds of the above, ternary (three elements, e.g. InGaAs) and quaternary (four elements, e.g. InGaAsP) compounds are also are included.

The semiconductor layer in the article can also comprise an elemental semiconductor or alloys of elements within the same group such as SiC and SiGe or a compound semiconductor comprising elements of group IB, IIIA and VIA of the periodic table such as alloys of copper, indium, gallium, aluminum, selenium and sulfur.

Figure 3:
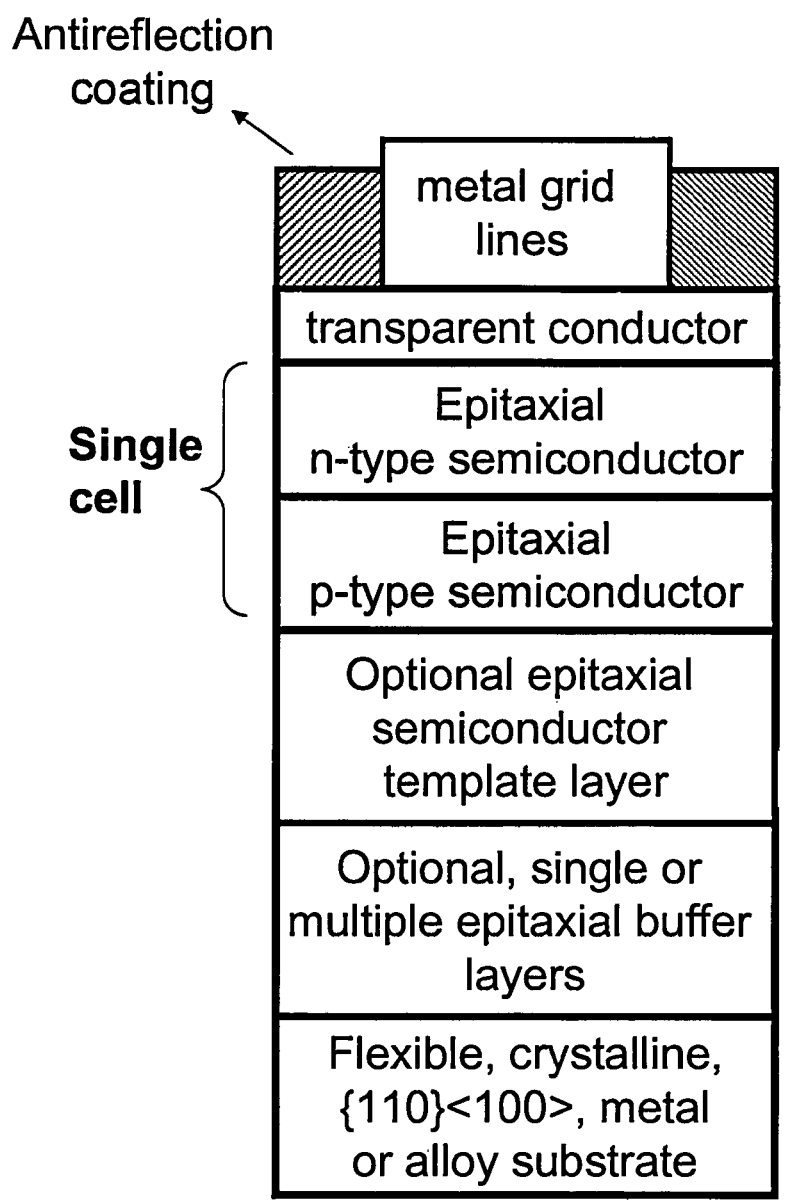
FIG. 3 shows an idealized schematic representation in cross-section of an electronic device containing an epitaxial, pn junction in accordance with the present invention, with the pn junction being parallel to the substrate surface.

FIG. 3 shows an idealized schematic representation in cross-section of an electronic device containing an epitaxial, pn junction in accordance with the present invention, with the pn junction being parallel to the substrate surface. FIG. 3 shows a device comprising a flexible, crystalline, crystallographically textured, metal or alloy substrate with an optional, epitaxial, single or multiple buffer layers, an optional epitaxial, semiconductor template layer or a graded semiconductor template layer to provide improved lattice matching to device layer on top of the buffer layer(s); epitaxial p-type and n-type semiconductor layers on the top buffer layer or the optional semiconductor template layer, a transparent conductor layer and an antireflection coating with metal grid lines. One use of such a device as shown in FIG. 3 is for solar power generation. FIG. 4 shows an idealized schematic representation in cross-section of certain specific embodiments of multilayer structures in accordance with the present invention. The figure shows a flexible, crystalline, metal or alloy substrate with a primary or secondary recrystallization texture of {110}<100>; optional, epitaxial, single or multiple buffer layers with at least the top buffer having a {110}<100> or a 45° rotated, {110}<100> texture; an optional, epitaxial semiconductor template layer or a graded semiconductor template layer to provide improved lattice matching to device layer on top of the buffer layer(s) and finally an epitaxial semiconductor device layer—single or multiple, selected from a group comprising of but not limited to those based on indirect bandgap, direct bandgap and multibandgap semiconductors. FIG. 5 shows an idealized schematic representation in cross-section of another preferred embodiment of multilayer structures in accordance with the present invention. The figure shows a flexible, crystalline, metal or alloy substrate with a primary or secondary recrystallization texture of {110}<100>; optional, epitaxial, single or multiple buffer layers with at least the top buffer having a {100}<100> or a 45° rotated, {100}<100> texture; an optional, epitaxial semiconductor template layer or a graded semiconductor template layer to provide improved lattice matching to device layer on top of the buffer layer(s) and finally an epitaxial semiconductor device layer—single or multiple, selected from a group comprising of but not limited to those based on indirect bandgap, direct bandgap and multi-bandgap semiconductors.

Figure 6:
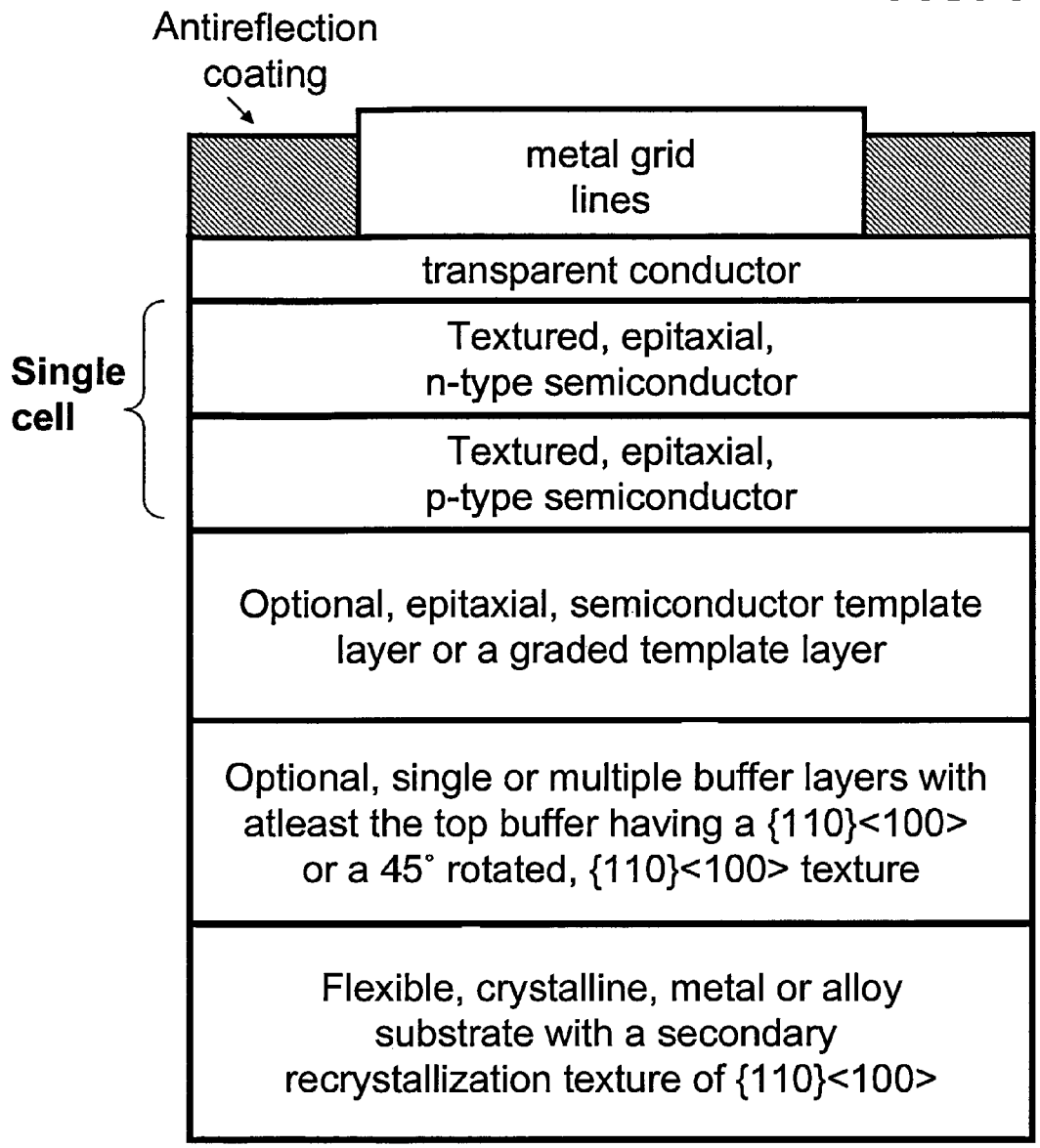
FIG. 6 shows an idealized schematic representation in cross-section of an electronic device containing an epitaxial, textured pn junction in accordance with the present invention, with the pn junction being parallel to the substrate surface.
Figure 7:
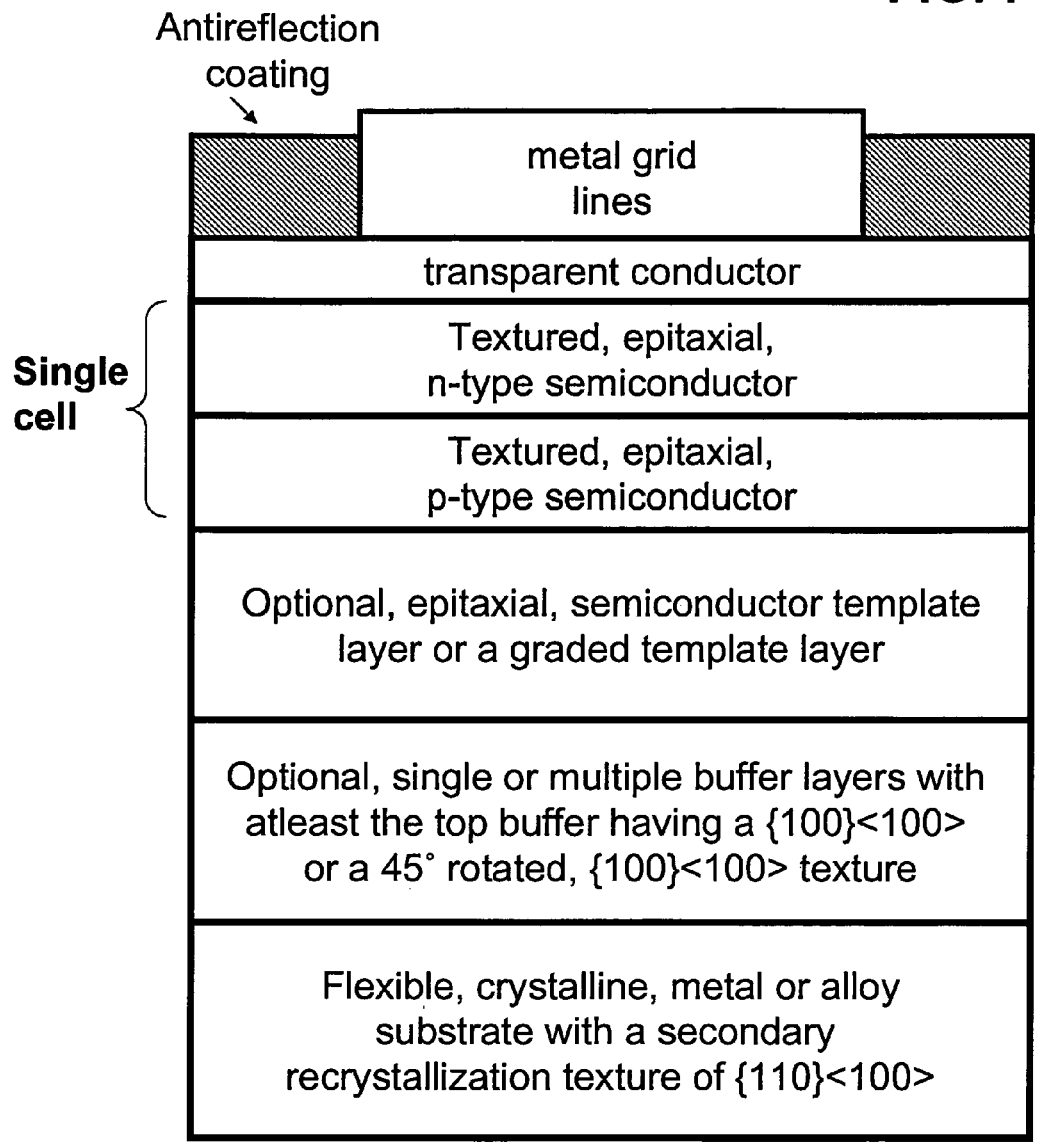
FIG. 7 shows an idealized schematic representation in cross-section of an electronic device containing an epitaxial, textured pn junction in accordance with the present invention, with the pn junction being parallel to the substrate surface.

FIG. 6 shows an idealized schematic representation in cross-section of an electronic device containing an epitaxial, textured pn junction in accordance with the present invention, with the pn junction being parallel to the substrate surface. FIG. 6 shows a device comprising a flexible, crystalline, metal or alloy substrate with a primary or secondary recrystallization texture of {110}<100>; optional, epitaxial, single or multiple buffer layers with at least the top buffer having a {110}<100> or a 45° rotated, {110}<100> texture; optional epitaxial, semiconductor template layer or a graded semiconductor template layer to provide improved lattice matching to device layer on top of the buffer layer(s); textured, epitaxial p-type and n-type semiconductor layers on the top buffer layer or the optional semiconductor template layer; a transparent conductor layer and an antireflection coating with metal grid lines. One use of such a device as shown in FIG. 6 is for solar power generation. FIG. 7 shows an idealized schematic representation in cross-section of a another electronic device containing an epitaxial, textured pn junction in accordance with the present invention, with the pn junction being parallel to the substrate surface. FIG. 7 shows a device comprising a flexible, crystalline, metal or alloy substrate with a primary or secondary recrystallization texture of {110}<100>; optional, epitaxial, single or multiple buffer layers with at least the top buffer having a {100}<100> or a 45° rotated, {100}<100> texture; optional epitaxial, semiconductor template layer or a graded semiconductor template layer to provide improved lattice matching to device layer on top of the buffer layer(s); textured, epitaxial p-type and n-type semiconductor layers on the top buffer layer or the optional semiconductor template layer; a transparent conductor layer and an antireflection coating with metal grid lines. One use of such a device as shown in FIG. 7 is for solar power generation.

A p-type semiconductor is obtained by carrying out a process of doping in which certain types of atoms are incorporated into the semiconductor in order to increase the number of free (in this case positive) charge carriers. When the doping material is added, it takes away (accepts) weakly-bound outer electrons from the semiconductor atoms. This type of doping agent is also known as acceptor material and the semiconductor atoms that have lost an electron are known as holes. The purpose of p-type doping is to create an abundance of holes. In the case of silicon, a trivalent atom (typically from group IIIA of the periodic table, such as boron or aluminum) is substituted into the crystal lattice. The result is that one electron is missing from one of the four covalent bonds normal for the silicon lattice. Thus the dopant atom can accept an electron from a neighboring atoms' covalent bond to complete the fourth bond. Such dopants are called acceptors. The dopant atom accepts an electron, causing the loss of half of one bond from the neighboring atom and resulting in the formation of a "hole". Each hole is associated with a nearby negative-charged dopant ion, and the semiconductor remains electrically neutral as a whole. However, once each hole has wandered away into the lattice, one proton in the atom at the hole's location will be "exposed" and no longer cancelled by an electron. For this reason a hole behaves as a quantity of positive charge. When a sufficiently large number of acceptor atoms are added, the holes greatly outnumber the thermally-excited electrons. Thus, the holes are the majority carriers, while electrons are the minority carriers in p-type materials. An n-type semiconductor is obtained by carrying out a process of doping, that is, by adding an impurity of valence-five elements to a valence-four semiconductor in order to increase the number of free (in this case negative) charge carriers. When the doping material is added, it gives away (donates) weakly-bound outer electrons to the semiconductor atoms. This type of doping agent is also known as donor material since it gives away some of its electrons. The purpose of n-type doping is to produce an abundance of mobile or "carrier" electrons in the material. To help understand how n-type doping is accomplished, consider the case of silicon (Si). Si atoms have four valence electrons, each of which is covalently bonded with one of four adjacent Si atoms. If an atom with five valence electrons, such as phosphorus (P), arsenic (As), or antimony (Sb), is incorporated into the crystal lattice in place of a Si atom, then that atom will have four covalent bonds and one unbonded electron. This extra electron is only weakly bound to the atom and can easily be excited into the conduction band. At normal temperatures, virtually all such electrons are excited into the conduction band. Since excitation of these electrons does not result in the formation of a hole, the number of electrons in such a material far exceeds the number of holes. In this case the electrons are the majority carriers and the holes are the minority carriers. Because the five-electron atoms have an extra electron to "donate", they are called donor atoms. Hence, p and n-type semiconductors can be fabricated by appropriate doping of elements. The device in FIGS. 6 and 7 is referred to a p-n junction, with the junction being parallel to the substrate surface. The p-type and n-type layer combination is referred to as a single cell. This device shown in FIG. 6-7 is only a simple example of a possible device structure that can be fabricated based on this invention. A possible use of such a device is as a solar cell or a photovoltaic cell to convert sunlight into electrical energy. The order of which layer, namely the p-type or n-type can be changed. Also, in some cases it may be desirable to include layers of p+ in which the excess mobile hole concentration is very large. Similarly an n+ layer can be deposited. Such layers can also be used for making electrical contacts in devices.

The basic structures shown in FIG. 2-7 can be used to fabricate a whole range of electronic devices such as photovoltaic devices, flat-panel displays, thermophotovoltaic devices, ferroelectric devices, light emitting diode devices, computer hard disc drive devices, magnetoresistance based devices, photoluminescence based devices, non-volatile memory devices, dielectric devices, thermoelectric devices and quantum dot laser devices. Electronic devices that can readily be envisioned are two terminal devices such as a diode; three terminal devices such as a transistor, thyristor or rectifier; and multi-terminal devices such as a microprocessor, random access memory, read-only-memory or a charge-coupled device.

Some of most exciting applications are in photovoltaics or solar cells and for displays such as thin-film transistors. In both of these areas, there is has been a drive to use thin films on metal substrates. However, in these cases, the semiconductor is either amorphous or polycrystalline and hence with lower performance than obtained from a single crystal device of the same semiconductor. Mechanically flexible electronics have the potential to realize novel applications in which in which physical and mechanical restrictions do not permit the use of rigid substrates. Furthermore, with flexible substrates, roll-to-roll manufacturing can be envisioned similar to a printing press with a throughput significantly higher than normal discrete semiconductor device manufacturing. In some of the applications alluded to above, relatively relaxed device requirements exist compared to other semiconductor devices. The integration of triaxially textured, single-crystal-like semiconductor layers and devices on large-area, flexible, metal, alloy and ceramic substrates, can revolutionize these applications in these areas. Single-crystal devices on flexible substrates will result in photovoltaic cells with high efficiencies and thin-film transistors (TFT) with higher electron mobilities.

There is significant interest in the fabrication of TFT circuits on flexible metal or alloy foils. See for example—Thesis S. D. and Wagner S., "Amorphous silicon thin-film transistors on steel foil substrates," IEEE Electron Device Lett., vol. 17, no. 12, pp. 578-580, December 1996; Serikawa T. and Omata F., "High-mobility poly-Si TFT's fabricated on flexible stainless steel substrates," IEEE Electron Device Lett., vol. 20, no. 11, pp. 574-576, November 1999; Afentakis T. and Hatalis M., "High performance polysilicon circuits on thin metal foils," Proc. SPIE, vol. 5004, pp. 122-126, 2003; Howell R. S., Stewart M., Kamik S. V., Saha S. K. and Hatalis M. K., IEEE Electron Device Lett., vol. 21, no. 2, pp. 70-72, February 2000. In all four of these papers, the result is an oriented, polycrystalline or amorphous Si layer. In most cases wherein polycrystalline Si is used, it is a laser crystallized layer of Si. An amorphous layer of Si is first deposited on to the substrate followed by a crystallization step. This crystallization can also be done using infrared lamps which provide for a high heating rate. A similar process can be used to fabricate epitaxial silicon on the substrates disclosed in this invention. This process of first depositing a precursor film of amorphous Si followed by a subsequent crystallization step is referred to as an "ex-situ" process. Crystalline Si can also be directly deposited epitaxially on single crystal-like substrate at elevated temperatures. Triaxially textured, single-crystal devices on flexible metal, alloy and ceramic substrates will result in thin-film transistors (TFT) with higher electron mobilities than can be fabricated using unoriented silicon and hence truly have the potential for revolutionizing this application. Advanced flat panel displays including active matrix liquid crystal displays (LCD) have mainly used thick glass as the substrate which offers advantages of transparency and stability but is very fragile and heavy. The substrates suggested here will be rugged and light weight and because of the device layer being triaxially textured or single-crystal-like, will have a performance far superior to those possible on rigid glass substrates. Flat panel display applications are enormous and include computer monitors, televisions, large electronic billboards, cell phones, calculators and display screens on a whole set of consumer electronics. For portable displays active-matrix liquid crystal displays (AMLCDs) and active-matrix organic light emitting diode (AMOLED), using a low temperature processed polycrystalline Si on glass is being widely considered for large-scale applications. An active-matrix OLED (AMOLED) display consists of organic light emitting diode (OLED) pixels that have been deposited or integrated onto a thin film transistor (TFT) array to form a matrix of pixels that illuminate light upon electrical activation. In contrast to a passive-matrix OLED display, where electricity is distributed row by row, the active-matrix TFT backplane acts as an array of switches that control the amount of current flowing through each OLED pixel. The TFT array continuously controls the current that flows to the pixels, signaling to each pixel how brightly to shine. Typically, this continuous current flow is controlled by at least two TFTs at each pixel, one to start and stop the charging of a storage capacitor and the second to provide a voltage source at the level needed to create a constant current to the pixel. As a result, the AMOLED operates at all times (i.e., for the entire frame scan), avoiding the need for the very high currents required for passive matrix operation. Poly-Silicon backplane technology for fabricating the TFT array is the technology-of-choice for OLEDs today because it provides reasonable mobilities that meet OLED current drive requirements (see for example, Afentakis T., Hatalis M., Voutsas T. and Hartzell J., "Poly-silicon TFT AM-OLED on thin flexible metal substrates," Proc. SPIE, vol. 5004, pp. 187-191, 2003). Poly-Si technology also allows for the integration of the drive circuitry directly onto the substrate. There are many key challenges, however, to address: reducing threshold voltage non-uniformities of poly-Si, and demonstrating commercially-viable manufacturing yields. These issues can potentially be addressed using the devices of this invention wherein triaxially textured or single-crystal-like nature of the semiconductor device layer will reduce non-uniformities and increase yields, significantly increase mobilities and still be light weight because no glass is used. FIG. 8A shows a schematic of a simple AMOLED device. FIG. 8A when coupled with FIGS. 2-7, shows how an AMOLED based on this invention can be fabricated, wherein the TFT/Substrate array is fabricated using this invention.

An important application of the devices disclosed in this invention is in the area of photovoltaics. The devices shown schematically in FIGS. 2-7 can be used as a photovoltaic or solar cell. These devices will be large-area and flexible and can be put on roofs. Flexible solar cells are also useful for space applications since large arrays or spools of photovoltaic modules can be wrapped up and then unspooled in space.

In some cases, an additional semiconductor template layer is used before the semiconductor device layer(s). This semiconductor template layer again is used to provide for a better lattice match to semiconductor device layer. Another function of the top buffer layer is to provide a stable, smooth and dense surface to grow the semiconductor layer on. Buffer layer surfaces can be conditioned chemically or thermally. In chemical conditioning, one or more chemical species in gaseous or solution form is used modify the surface of the buffer layer. In thermal conditioning, the buffer layer is heated to an elevated temperature wherein surface reconstruction takes place. Surface conditioning can also be done using standard and well developed techniques of plasma etching and reactive ion etching (see for example, Silicon processing for the VSLI Era, Vol. 1, eds. S. Wolf and R. N. Tanber, pages 539-574, Lattice Press, Sunset Park, Calif., 1986).

One way to make solar cells more efficient is to find a material that will capture energy from a larger portion of the spectrum of sunlight—from infrared to visible light to ultra-violet. Energy transfers from photons to a photovoltaic material when the material absorbs lightwaves that contain the same amount of energy as its bandgap. A bandgap is the energy ($E_g$) required to push an electron from a material's valence band to the conduction band where electrons are free to flow. FIG. 8B shows a schematic of a device containing three photovoltaic cells of different bandgaps. This structure, also called a cascade or tandem cell, can achieve higher total conversion efficiency by capturing a larger portion of the solar spectrum. In the typical multijunction cell, individual cells with different bandgaps are stacked on top of one another. The individual cells are stacked in such a way that sunlight falls first on the material having the largest bandgap. Photons not absorbed in the first cell are transmitted to the second cell, which then absorbs the higher-energy portion of the remaining solar radiation while remaining transparent to the lower-energy photons. These selective absorption processes continue through to the final cell, which has the smallest bandgap. Such multijunction cells can result in very high efficiencies. Principals of multijunction cells can be obtained from prior art (Martin A. Green, Keith Emery, Klaus Bucher, David L. King, Sanekazu Igari, "Solar cell efficiency tables (version 11)," Progress in Photovoltaics: Research and Applications, Volume 6, Issue 1, Pages 35-42, 4 May 1999; Karam, N. H.; King, R. R.; Cavicchi, B. T.; Krut, D. D.; Ermer, J. H.; Haddad, M.; Li Cai; Joslin, D. E.; Takahashi, M.; Eldredge, J. W.; Nishikawa, W. T.; Lillington, D. R.; Keyes, B. M.; Ahrenkiel, R. K., "Development and characterization of high-efficiency Ga0.5In0.5P/GaAs/Ge dual- and triple-junction solar cells," Electron Devices, IEEE Transactions on, Vol. 46, No. 10, pp. 2116-2125, October 1999; H. Hou, K. Reinhardt, S. Kurtz, J. Gee, A. Allerman, B. Hammons, P. Chang, E. Jones, Novel InGaAsN pn junction for high-efficiency multiple-junction solar cells, The Second World Conference on PV Energy Conversion, 1998, pp. 3600-3603; D. Friedman, J. Geisz, S. Kurtz, J. Olson, 1-eV GaInNAs solar cells for ultra high efficiency multijunction devices, The Second World Conference on PV Energy Conversion, 1998, pp. 3-7; T. V. Torchynska and G. Polupan, "High efficiency solar cells for space applications," Superficies y Vacio 17(3), 21-25, septiembre de 2004; R. McConnell and M. Symko-Davies, "DOE High Performance Concentrator PV Project," International Conference on Solar Concentrators for the Generation of Electricity or Hydrogen, 1-5 May 2005, Scottsdale, Ariz., NREL/CD-520-38172).

Figure 9:
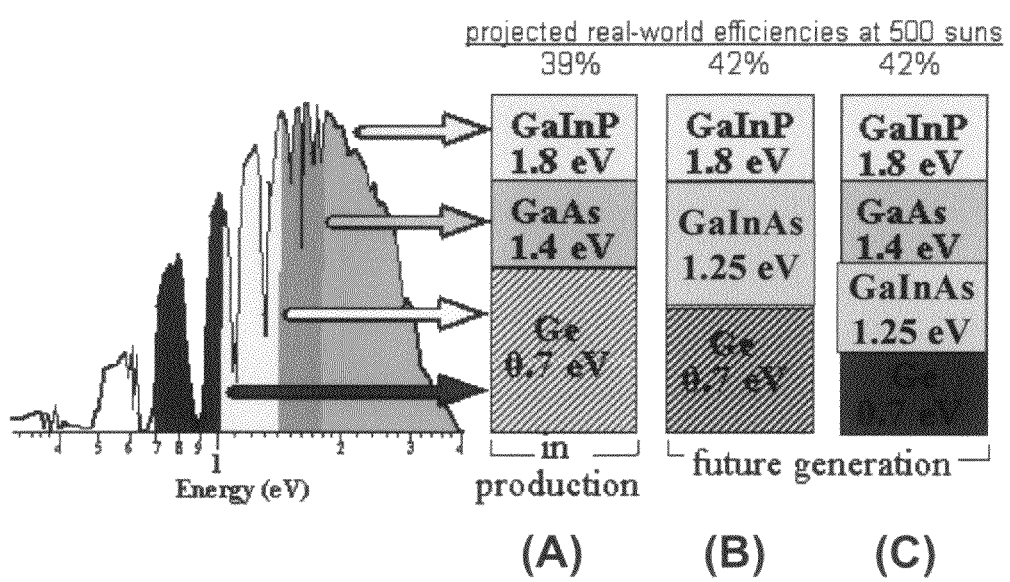
FIG. 9 shows the cross-section of some multijunction cells that have been reported in the literature. The schematic shows the portion of the sun's spectrum that they capture and the projected conversion efficiencies of these cells which are all close to 40%.
Figure 10:
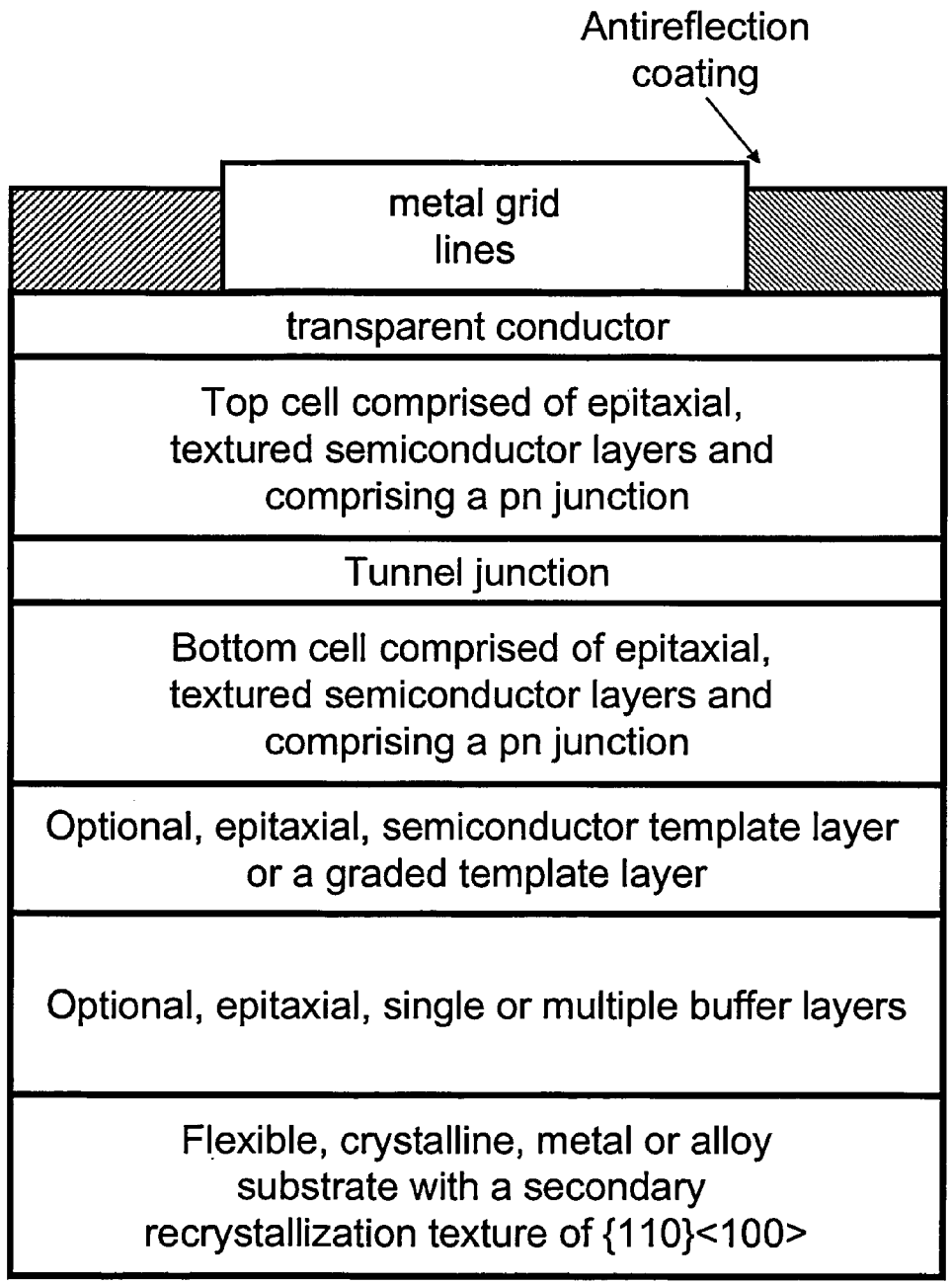
FIG. 10 shows an idealized schematic representation in cross-section of a multijunction electronic device containing two textured, epitaxial pn junctions in accordance with the present invention, with the pn junctions being parallel to the substrate surface based on the device shown in FIG. 6-7.
Figure 11:
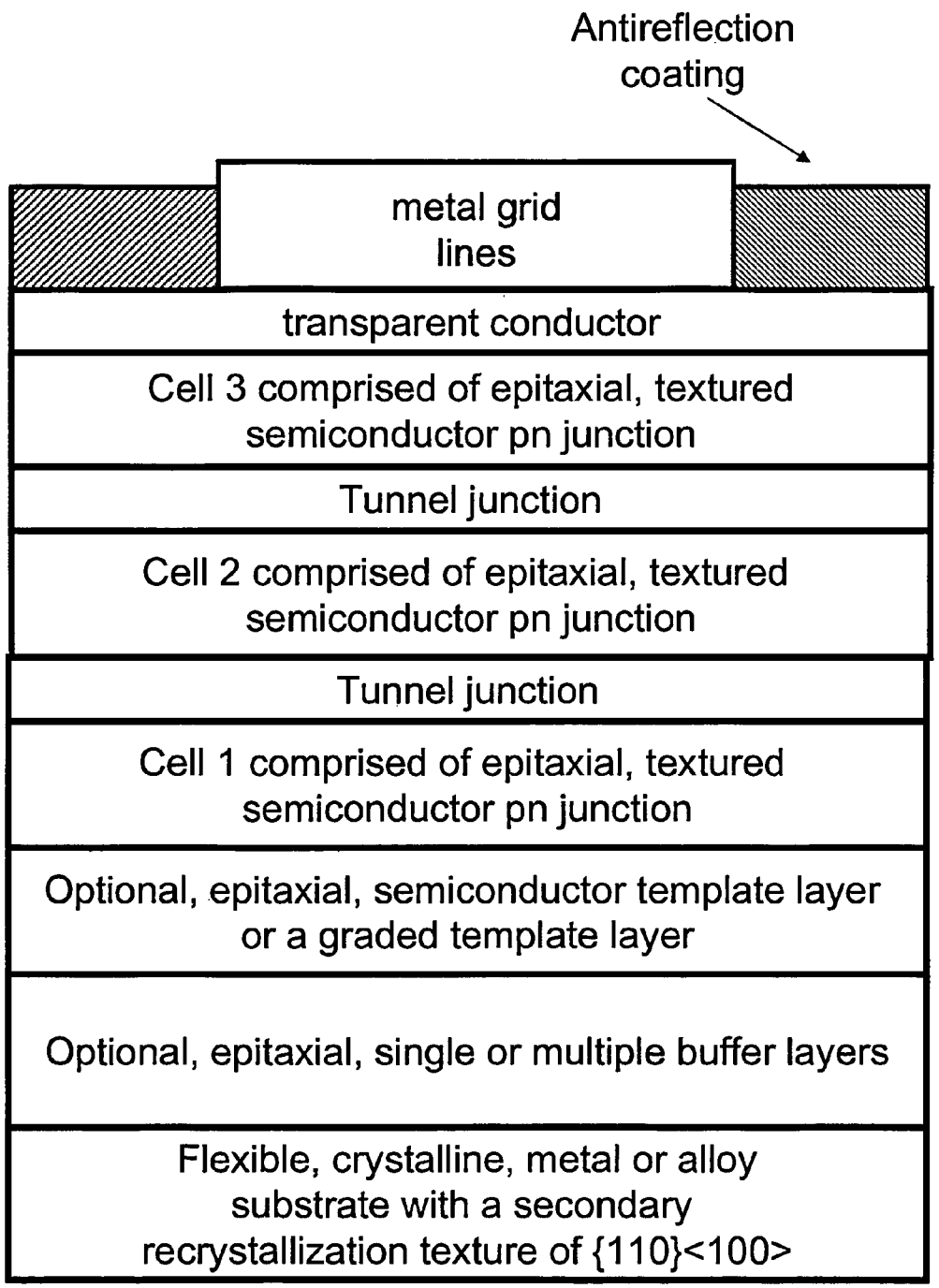
FIG. 11 shows an idealized schematic representation in cross-section of a multijunction electronic device containing three textured pn junctions in accordance with the present invention, with the pn junctions being parallel to the substrate surface.

Shown in FIG. 9 is the cross-section of some multijunction cells that have been reported in the literature. The schematic shows the portion of the sun's spectrum that they capture and the projected conversion efficiencies of these cells which are all close to 40%. FIG. 9A shows, a tri-junction cell of GaInP (Eg=eV)/GaAs (1.4 eV)/Ge (0.7 eV); FIG. 9B shows a tri-junction cell of GaInP (Eg=eV)/GaInAs (1.25 eV)/Ge (0.7 eV); and FIG. 9C shows a four-junction cell of GaInP (Eg=eV)/GaAs (1.4 eV)/GaInAs (1.25 eV)/Ge (0.7 eV). Clearly the advantage of capturing a higher portion of sun's spectrum is higher conversion efficiency. FIG. 10 shows an idealized schematic representation in cross-section of a multijunction electronic device containing two textured, epitaxial pn junctions in accordance with the present invention, with the pn junctions being parallel to the substrate surface. FIG. 10 shows a device comprising a flexible, crystalline, crystallographically textured, metal or alloy substrate similar to that described in FIG. 2-7; crystallographically, textured, single or multiple buffer layers; an optional, epitaxial, semiconductor layer or a compositionally graded template layer; a textured, epitaxial bottom cell comprising a pn junction; a tunnel junction; a top cell comprising a pn junction; a transparent conductor layer; an antireflection coating and metal grid lines. One use of devices shown in FIG. 10 is for solar power generation. FIG. 11 shows an idealized schematic representation in cross-section of a multijunction electronic device containing three textured pn junctions in accordance with the present invention, with the pn junctions being parallel to the substrate surface. FIG. 11 shows a device comprising a flexible, crystalline, crystallographically textured, metal or alloy substrate similar to that described in FIGS. 1-7; crystallographically, textured, single or multiple buffer layers; an optional, epitaxial, semiconductor layer or a compositionally graded template layer; a textured, epitaxial bottom cell comprising a pn junction; a tunnel junction; a middle cell comprising a pn junction; a tunnel junction; a top cell comprising a pn junction; a transparent conductor layer; an antireflection coating and metal grid lines. Again, one use of devices shown in FIG. 11 is for solar power generation.

Figure 12:
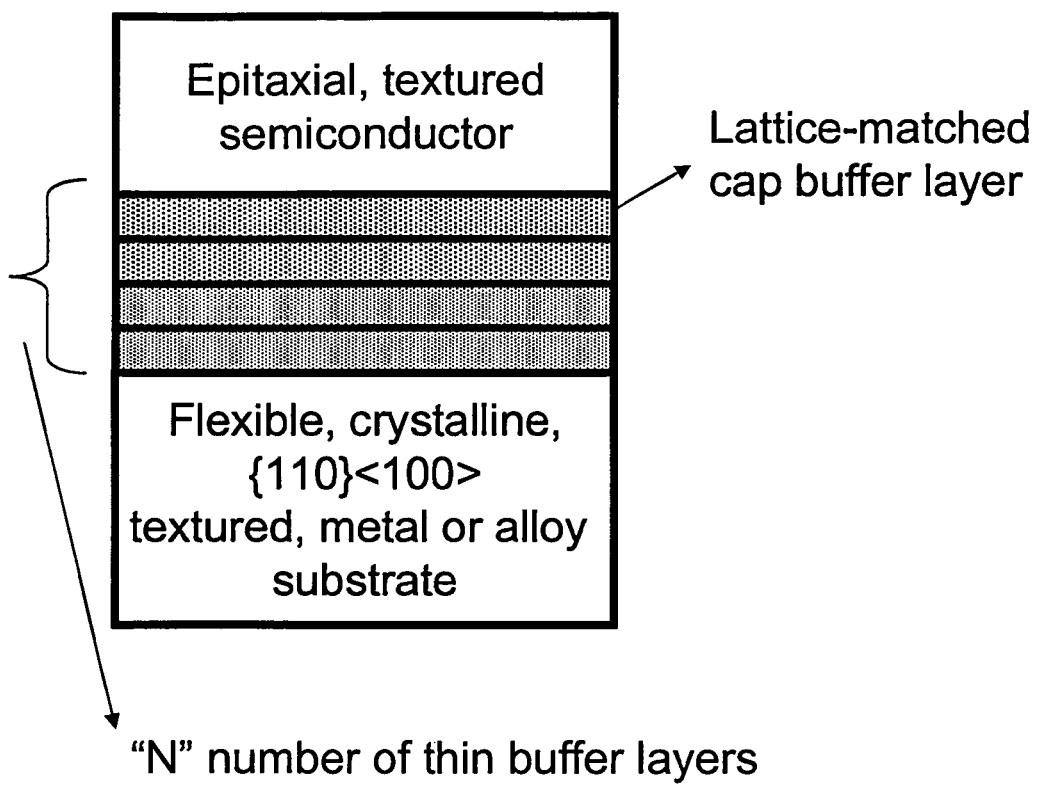
FIG. 12 shows an idealized schematic representation in cross-section of an electronic device as depicted in FIGS. 1-7 and 10-11, with the buffer layer stack comprised of a number of thin buffer layers so as to provide a good lattice match to the semiconductor layer grown on the top buffer template. This referred to as a "compositionally graded buffer approach" for providing a good lattice match to the semiconductor to minimize defect density in the semiconductor layer.

Performance of an electronic device is dependent on defect density. One way to reduce defect density in the active semiconductor layer is to reduce its lattice mismatch to the top buffer layer. This can be done using a "graded buffer layer" approach. FIG. 12 shows an idealized schematic representation in cross-section of an electronic device as depicted in FIGS. 2-7 and 10-11, with the buffer layer stack comprised of a number of thin buffer layers with gradually differing lattice parameters so as to provide a good lattice match to the semiconductor layer grown on the top buffer template. This is referred to as a "graded buffer approach" for providing a good lattice match to the semiconductor to minimize defect density in the semiconductor layer. The number of layers of graded lattice parameter buffers that need to be deposited depends on lattice mismatch between the semiconductor and the substrate.

Buffer layers for use in this invention can be selected from a group comprising a metal, an alloy, a nitride, boride, oxide, fluoride, carbide, silicide or combinations thereof. The buffer layer can be a nitride buffer layer corresponding to a composition of MN, wherein N is Nitrogen and M is selected from a group comprising Ti, Ce, Y, Zr, Hf, V, Nb, Nd, La, and Al and their combinations thereof. The buffer layer can be an oxide buffer layer selected from a group comprising gamma $Al_2O_3$ (cubic form of $Al_2O_3$); perovskites such as but not limited to $SrTiO_3$, $(Sr,Nb)TiO_3$, $BaTiO_3$, $(Ba,Ca)TiO_3$, $LaMnO_3$, $LaAlO_3$, doped perovskites such as $(La,Sr)MnO_3$, $(La,Ca)MnO_3$; layered perovskites such as $Bi_4Ti_3O_{12}$; pyrochlores such as but not limited to $La_2Zr_2O_7$, $Ca_2Zr_2O_7$, $Gd_2Zr_2O_7$; fluorites such as $Y_2O_3$, YSZ; rock-salt oxides such as but not limited to MgO; spinels such as but not limited to $MgAl_2O_4$, The buffer layer can also comprise a mixture of a nitride and an oxide with a chemical formula $MN_xO_y$ (1<x, y>0), wherein N is Nitrogen and O is Oxygen, and M is selected from a group comprising Ti, Ce, Y, Zr, Hf, V, Nb, Nd, La, and Al and their combinations thereof. A structural template comprised of buffer layers is needed to obtain a good lattice match to the semiconductor layer being grown so as to minimize the defect density in the semiconductor layer.

A better lattice match to the semiconductor layer to enable higher quality epitaxy and reduce the defect density in the semiconductor layer can also be obtained by using mixed or doped rock salt structure buffer layers, mixed or doped perovskite buffer layers, mixed of doped pyrochlore buffer layers, For example mixed rock-salt structure oxides (AO, where A is a metal), nitrides (AN, where A is a metal) and oxynitrides ($AN_xO_{1-x}$, where A is a metal), mixed perovskites ($ABO_3$, where A and B are metals), mixed pyrochlores ($A_2B_2O_7$, where A and B are metals) or mixed bixbyite ($A_2O_3$, where A is a metal) structure oxide buffer layers can be used to tailor the lattice constant in order to obtain a better lattice match to the semiconductor layer. The following mixed oxide and nitride buffer layers are of interest in particular:

1) Mixed rock-salt structure oxides and nitrides such as $A_xB_{1-x}O$ and $A_xB_{1-x}N$, where A and B are different metals. For example, $Ba_{0.64}Sr_{0.36}O$, a solid solution of BaO and SrO, provides an excellent lattice match to Si.
2) Mixed oxynitrides such as $A_xB_{1-x}N_yO_{1-y}$, where A and B are different metals.
3) Mixed bixbyite structures such as $(A_xB_{1-x})_2O_3$ where A and B are different metals.

4) Mixed perovskites $(A_xA'_{1-x})BO_3$, $(A_xA'_{1-x})(B_yB'_{1-y})O_3$, where A, A', B and B' are different metals. For example, $Ca_{0.95}Sr_{0.05}TiO_3$, a solid solution of $CaTiO_3$ and $SrTiO_3$, provides an excellent lattice match to Si.
5) Mixed pyrochlores—$(A_xA'_{1-x})_2B_2O_7$, $(A_xA'_{1-x})_2(B_yB'_{1-y})_2O_7$, where A, A', B and B' are different metals.

Figure 13:
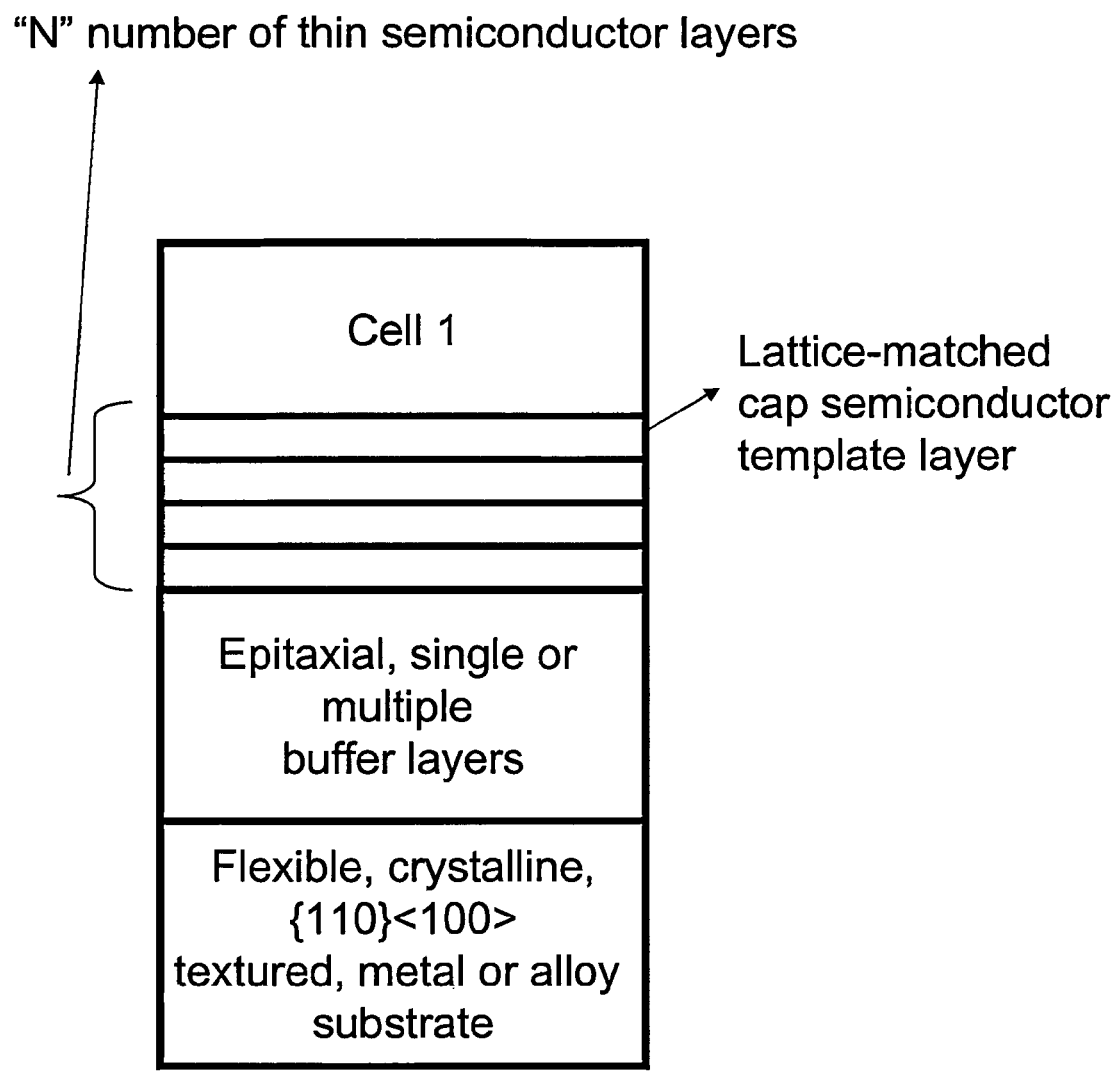
FIG. 13 shows an idealized schematic representation in cross-section of an electronic device as depicted in FIG. 1-12, with the semiconductor template layer comprised of a number of thin layers so as to provide a good lattice match to the semiconductor device layer or the first cell comprising the pn junction and grown on top of the semiconductor template layer. This is referred to as a "graded semiconductor approach" for providing a good lattice match to the semiconductor device layer to further minimize defect density in the semiconductor device layer.
Figure 14:
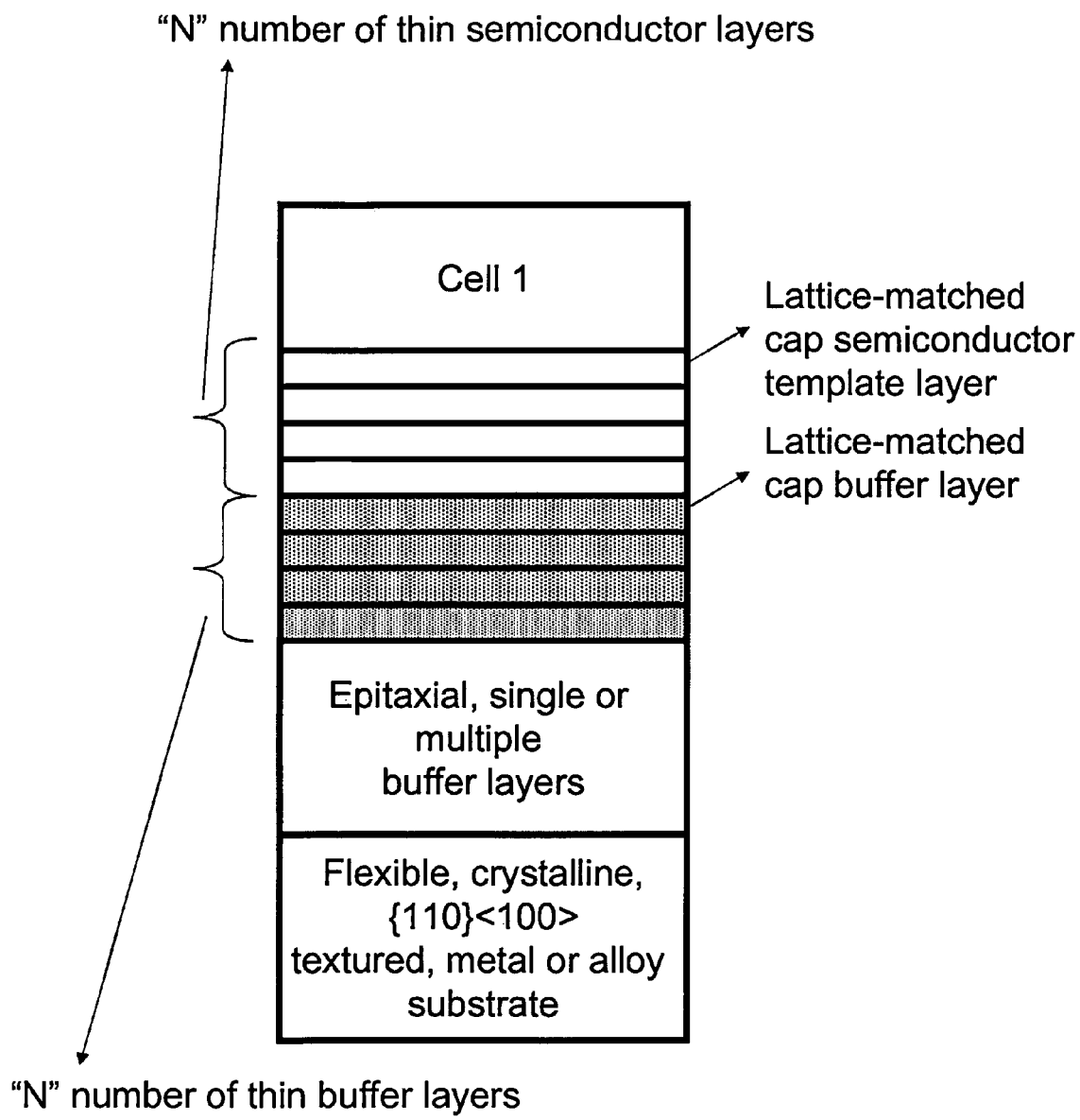
FIG. 14 shows an idealized schematic representation in cross-section of an electronic device as depicted in FIG. 1-13, with the buffer layer stack comprised of a number of thin buffer layers so as to provide a good lattice match to the semiconductor template layer grown on the top buffer template. In addition, the semiconductor template layer is comprised of a number of thin layers so as to provide a good lattice match to the semiconductor device layer or the first cell comprising the pn junction and grown on top of the semiconductor template layer. This referred to as a combination of the "graded buffer approach" and the "graded semiconductor approach" for providing a good lattice match to the semiconductor device layer to minimize defect density in the this layer.

In some cases, it is more desirable to use a "graded semiconductor template" approach to reduce the defect density in the active semiconductor layer comprising the electronic device. FIG. 13 shows an idealized schematic representation in cross-section of an electronic device as depicted in FIGS. 2-7 and 10-12, with the semiconductor template layer comprised of a number of thin layers with gradually differing lattice parameters, so as to provide a good lattice match to the semiconductor device layer or the first cell comprising the pn junction and grown on top of the semiconductor template layer. This is referred to as a "graded semiconductor approach" for providing a good lattice match to the semiconductor device layer to further minimize defect density in the semiconductor device layer. In the final case, one can envision a combination of the "graded buffer layer" and the "graded semiconductor template" approach. FIG. 14 shows an idealized schematic representation in cross-section of an electronic device as depicted in FIG. 2-7 and 10-13, with the buffer layer stack comprised of a number of thin buffer layers so as to provide a good lattice match to the semiconductor template layer grown on the top buffer template. In addition, the semiconductor template layer is comprised of a number of thin layers so as to provide a good lattice match to the semiconductor device layer or the first cell comprising the pn junction and grown on top of the semiconductor template layer. This referred to as a combination of the "graded buffer approach" and the "graded semiconductor approach" for providing a good lattice match to the semiconductor device layer to minimize defect density in the this layer.

FIG. 15 shows an idealized schematic representation in cross-section of various embodiments of multilayer structures in accordance with the present invention. FIG. 15A shows a flexible, crystalline, {110}<100> textured metal or alloy substrate; an epitaxial and optionally graded, cubic oxide, nitride, boride, fluoride, silicide or geraminicide buffer layer(s) on top of the substrate, an epitaxial semiconductor template layer or a graded template layer and an epitaxial semiconductor device layer(s). FIG. 15B shows a flexible, crystalline, {110}<100> textured metal or alloy substrate; an epitaxial and optionally graded metal or alloy layer(s), an epitaxial and optionally graded, cubic oxide, nitride, boride, fluoride, silicide or geraminicide buffer layer(s) on top of the substrate, an epitaxial semiconductor template layer or a graded template layer and an epitaxial semiconductor device layer(s).

There are a wide range of techniques available for deposition of the semiconductor device layer, for example a Si layer. Many of these have recently been reviewed (see for example, Michelle J. McCann, Kylie R. Catchpole, Klaus J. Weber, Andrew W. Blakers, "A review of thin-film crystalline silicon for solar cell applications. Part 1: Native substrates," Solar Energy Materials and Solar Cells, Vol. 68, Issue 2, May 2001, Pages 135-171; Kylie R. Catchpole, Michelle J. McCann, Klaus J. Weber and Andrew W. Blakers, "A review of thin-film crystalline silicon for solar cell applications. Part 2: Foreign substrates," Solar Energy Materials and Solar Cells, Vol. 68, Issue 2, May 2001, Pages 173-215). The techniques of electron-beam evaporation sputtering, ion-beam sputtering, chemical vapor deposition, metallorganic chemical vapor deposition, and combustion chemical vapor deposition are among the techniques that be used for deposition of the buffer and semiconductor layers.

It is also important to note that in the case of a single buffer layer or multiple buffer layers, reaction layers which are not crystallographically textured in the desirable orientation can form below the top buffer layer during deposition of subsequent layers. These do not affect the orientation of the device layer since there is a layer of suitably oriented buffer over it. In general, formation of a polycrystalline, crystallographically untextured, reaction layer can occur in a multilayer system as long as it forms after deposition of a suitably oriented layer above the layer in question is completed.

Some first order, coherent twin boundaries can be present in the silicon layer. However, such coherent twin boundaries are not quite detrimental and are not electronically active (Hjemas, P. C., Lohne, O., Wandera, A., Tathgar, H. S., "The effect of grain orientations on the efficiency of multicrystalline solar cells," Solid State Phenomena, vol. 95-96, pp. 217-222, 2004; B. Cunningham, H. Strunk and D. G. Ast, "First and second order twin boundaries in edge defined film growth silicon ribbon, Appl. Phys. Lett., 40, pp. 237-239, 982). While no other defects were clearly observed in the films made, if other defects do nucleate, they can be passivated to become electrically inactive or very less detrimental electronically. Such defects which need passivation commonly occur in single crystal wafers and ribbons used for solar cell fabrication. There is numerous prior art which establishes that such defects can be passivated (M. Rinio, M. Kaes, G. Hahn and D. Borchert, "Hydrogen passivation of extended defects in multicrystalline silicon solar cells," Presented at the 21$^{st}$ European Photovoltaic Solar Energy Conference and Exhibition, Dresden, Germany, 4-8, 9, 2006; A. Ebong, M. Hilali, A. Rohtagi, D. Meier and D. S. Ruby, "Belt furnace gettering and passivation of n-web silicon for high-efficiency screen-printed front-surface field solar cells," Progress in Photovoltaics: Research and Applications, 9, pp. 327-332, 2001; C. H. Seager, D. J. Sharp and J. K. G. Panitz, "Passivation of grain boundaries in silicon," J. Vac. Sci. & tech., 20, pp. 430-435, 1982; N. H. Nickel, N. M. Johnson and W. B. Jackson, "Hydrigen passivation of grain boundary defects in polycrystalline silicon thin films," Appl. Phys. Lett., 62, pp. 3285-3287, 1993; A. Ashok, "Research in hydrogen passivation of defects and impurities in silicon," NREL Report No. NREUSR-520-36096, May 2004; M. Lipinski, P. Panek, S. Kluska, P. Zieba, A. Szyszka and B. Paszkiewicz, "Defect passivation of multicrystalline silicon solar cells by silicon nitride coatings," Materials Science-Poland, vol. 24, pp. 1003-1007, 2006; V. Yelundur, "Understanding and implementation of hydrogen passivation of defects in string ribbon silicon for high-efficiency, manufacturable, silicon solar cells," Ph.D thesis, Georgia Institute of Technology, Atlanta, Ga., November 2003.)

Figure 16:
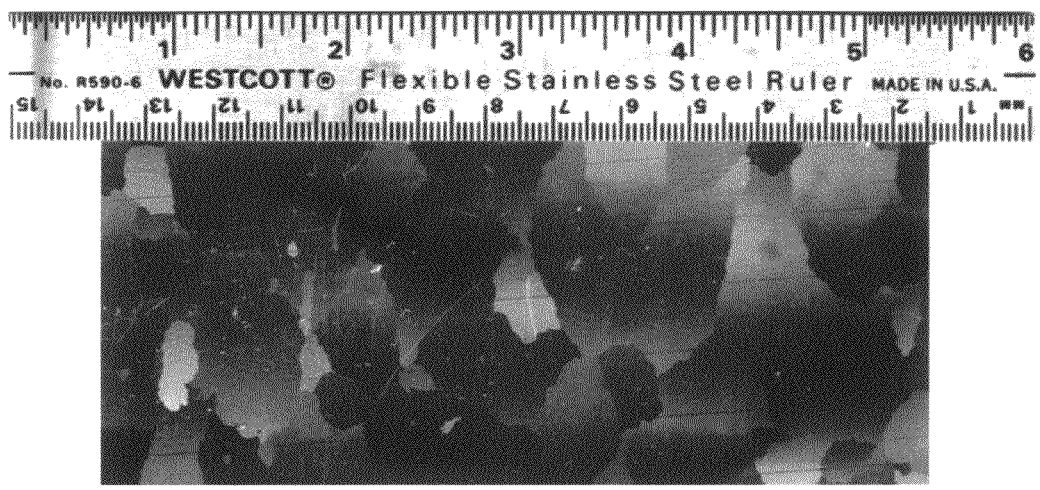
FIG. 16 shows an optical, polarized light micrograph of a {110}<100> textured, Fe-3 at % Si substrate. The large grain size in the substrate can be inferred from the adjoining ruler to the micrograph. An average grain size of over 1 cm can be inferred with many grains having one dimension in the range of 1 inch.

While all kinds of uniaxial, biaxial or triaxial texture in a metal or alloy substrate is of interest, particular interest with respect to this invention is for the <110><100> crystallographic orientation. In such a texture, the <100> direction is parallel to the long axis of the theormomechanically processed, rolled and recrystallized tape and the <110> plane is parallel to surface of the substrate. The {110}<100> orientation is typically produced by annealing above the secondary recrystallization temperature of the metal or alloy. The {110}<100> texture is most readily produced in body centered cubic metals and alloys such Fe-based alloys. Grain sizes exceeding 1 cm and approaching an inch are possible. Thermomechanical processing to fabricate such textured substrates can be extended to fabricate long and wide substrates of arbitrary lengths. FIG. 16 shows an optical, polarized light micrograph of a {110}<100> textured, Fe-3 at % Si substrate.

The large grain size in the substrate can be inferred from the adjoining ruler to the micrograph. An average grain size of over 1 cm can be inferred with many grains having one dimension in the range of 1 inch. FIG. 17 shows the texture of the substrate shown in FIG. 16. FIG. 17A shows a (200) pole-figure and FIG. 17B shows a corresponding (110) pole figure. Only a single texture corresponding to the {110}<100> texture is present. The texture shown in this figure is indicative of essentially a large, single crystal with a mosaic. Such a substrate with large grain sizes is very desirable for growth of semiconductors. For example, in a solar cell or photovoltaic application, the longest recombination length of all semiconductors is that of Si and is of the order of ~100 microns. The grain size of an epitaxially grown Si layer on a secondary recrystallized, {110}<100> Fe-3% Si substrate will also be in the range of a cm to a inch, far greater than the recombination length. Hence for all practical purposes, for the solar cell application, it would be as though the grain boundaries did not exist and there was one large single crystal of Si. When one considers other semiconductors, the situation is even more favorable as their recombination length is much smaller than that of Si. Details about how to form this sharp {110}<100> texture in Fe-3% Si alloys by secondary recrystallization can be found in book titled "Recrystallisation and related annealing phenomena" by FJ Humphreys, M Hatherly, published by Elsevier in 2004.

A very large fraction of the Silicon wafers used in the photovoltaic industry worldwide are in the form of 8 inch wafers which are rejects from the electronic industry. These wafers which contain many defects are otherwise single crystal crystallographically and have an area of 50.2 square inches (50.2 in$^2$). Recently, the electronic fabrication shops worldwide have re-tooled to accommodate larger silicon wafers of 12 inch diameter. It is possible for the photovoltaic industry to use reject wafers containing defects which are 12 inch in diameter as well with an area of 113 in$^2$. However, this is the maximum possible size of single crystal wafers available and that can be grown world-wide. This invention allows one to fabricate flexible, large-area, single-crystal or single crystal-like semiconductor materials which are larger than 50.2 in or 113.0 in$^2$. Textured metal and alloy substrates can be fabricated using thermomechanical processing to produce materials which have a {110}<100> texture. In such cases, continuous sheets of large-area substrates can be made upon which epitaxial layers are deposited leading to a triaxially textured electronic device. Substrates of lengths exceeding 100 meters and widths approaching one meter are possible. Also, as taught previously, several methods of continuously producing single crystal or single grain metal and/or alloy substrates are possible.

Figure 19:
FIG. 19 shows an electron-backscatter Kikuchi diffraction created orientation image of the Mo layer corresponding to FIG. 18. As expected 90 degree boundaries are observed everywhere.

In some cases, it may be desirable to grow semiconductors on refractory metals and alloys such those comprising Mo, Nb, W, Ta, Cr, V etc. This is especially so since the lattice parameters of such refractory metals and alloys are a closer match to semiconductor materials such as Si, Ge and GaAs. These refractory metals and their alloys are also more inert. All of these refractory metals and their alloys have a body centered cubic (BCC) crystal structure. It is well known in the field of epitaxial growth that there growth of a single orientation of a BCC alloy on a FCC alloy is very difficult. Hence, if a BCC refractory metal or alloy surface is desired it will be useful to deposit it on a textured BCC alloy surface. For example, starting with a cube-textured Ni-3 at % W alloy which has a cube-texture corresponding to {100}<100>, deposition of a Mo layer results in multiple orientations. FIG. 18A shows a (111) pole figure for a cube-textured, {100}<100> oriented, face centered cubic (FCC) NiW substrate. The four peaks are crystallographically equivalent and each corresponds to the {100}<100> orientation. FIG. 18B shows a (100) pole figure for a Mo film grown epitaxially on the {100}<100> textured NiW substrate. Here the inner peaks correspond to the (110) plane or orientation of the body centered cubic (BCC) Mo layer. So the (110) plane in the Mo layer is parallel to the (100) plane of the NiW substrate. The (110) plane has a two fold-symmetry and only a pair of inner peaks in the pole figure correspond to one orientation as indicated by the dotted white ellipse. The pole figure shows two white ellipses indicating that there are two epitaxial orientations of Mo on the NiW, which are rotated by 90 degrees. This is should result in numerous high-angle grain boundaries everywhere in the Mo layer. FIG. 19 shows an electron-backscatter Kikuchi diffraction created orientation image of the Mo layer corresponding to FIG. 18. The orientation image is obtained by taking over 50,000 electron diffraction patterns and then reconstructing the image based solely on orientation. As expected 90 degree or perpendicular grain boundaries are observed everywhere in the image.

In general, when epitaxially growing a BCC metal or alloy on a cube-textured, FCC metal or alloy, the results shown in FIG. 20 apply. FIG. 20A shows a (111) pole figure for a cube-textured, {100}<100> NiW substrate. Upon deposition of a Mo, Cr, W, Nb or another BCC metal or alloy the range of epitaxial orientations that can be obtained are shown in FIG. 20B in a (100) pole figure for a Mo layer. In addition to the two 90 degree rotated orientations shown in FIG. 18B, marked by "1" in FIG. 20B, there are two satellite peaks, labeled "2" around each of the four peaks corresponding to the peaks marked by "1". These satellite peaks create additional, high-angle grain boundaries in the BCC layer growth epitaxially on the FCC substrate. Another case which is not shown here is when only the orientations corresponding to "2" are present in the (100) Mo pole figure. In other words, only the two satellite peaks would be seen every 90 degrees in the pole figure. Of course, in each of these cases, many high-angle grain boundaries will be present and the effective grain size in the Mo layer or another BCC layer will be very fine and much smaller than the grain size in the FCC, {100}<100> oriented or cube-textured substrate.

The above stated problems of obtaining a single orientation epitaxy of a BCC alloy on a FCC alloy, can be overcome by depositing a BCC alloy on a BCC alloy. For example, single orientations can be obtained of BCC alloys on a BCC, Fe-3 at % Si alloy with a {110}<100> texture. FIG. 21A shows a (100) pole figure for a {110}<100> textured Fe-3% Si alloy substrate. The pole figure shows a clean, single orientation texture. FIG. 21B shows a (100) pole figure for a Mo layer deposited epitaxially on the Fe-3% Si alloy. Only a single orientation, near-perfect epitaxy is obtained. Similar single orientation epitaxy is obtained for other BCC metals and their alloys such as W, Nb, V, Cr.

Figure 22:
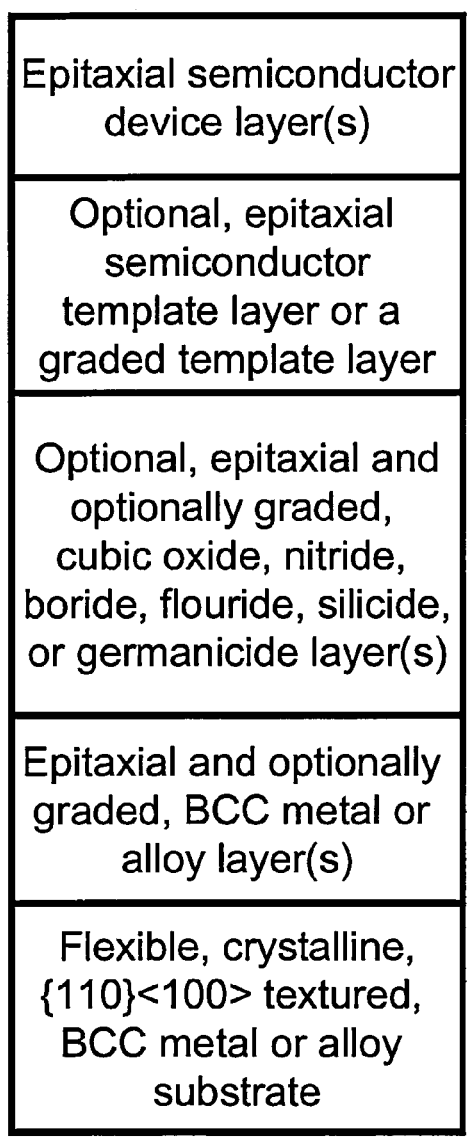
FIG. 22 shows a flexible, crystalline, {110}<100> textured, BCC metal or alloy substrate; an epitaxial and optionally graded, BCC metal or alloy layer(s), an epitaxial and optionally graded, cubic oxide, nitride, boride, fluoride, silicide or Germanicide buffer layer(s) on top of the substrate, an epitaxial semiconductor template layer or a graded template layer and an epitaxial semiconductor device layer(s).
Figure 23:
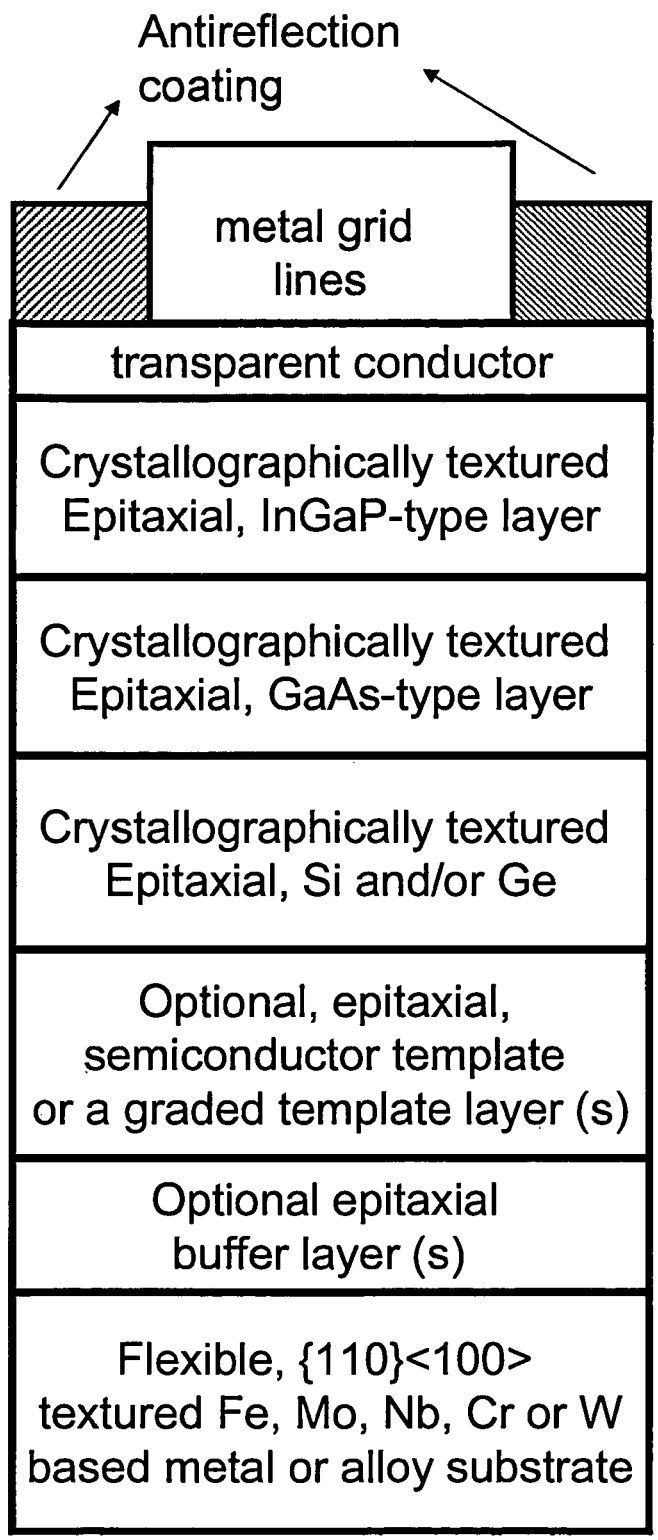
FIG. 23 shows an idealized schematic representation in cross-section of an electronic device containing a crystallographically textured semiconductor device in accordance with the present invention. The device comprises a flexible, {110}<100> textured Fe, Mo, Nb, Cr, or W-based, metal or alloy substrate; an optional, epitaxial buffer layer(s); an optional epitaxial semiconductor template layer(s) or an epitaxial graded semiconductor template layer(s); a crystallographically textured, epitaxial layer of Si and/or Ge; a crystallographically textured, epitaxial GaAs-type layer; a crystallographically textured, epitaxial InGaP-type layer; a transparent conductor layer, and optional antireflection coating and metal grid lines. The representation forms the general basis of a device. One can envisage additional semiconductor layers or junctions and/or buffer layers in this multilayered stack. One use of such a device is for solar power generation.

FIG. 22 shows a flexible, crystalline, {110}<100> textured, BCC metal or alloy substrate; an epitaxial and optionally graded, BCC metal or alloy layer(s), an epitaxial and optionally graded, cubic oxide, nitride, boride, fluoride, silicide or geraminicide buffer layer(s) on top of the substrate, an epitaxial semiconductor template layer or a graded template layer and an epitaxial semiconductor device layer(s). FIG. 23 shows an idealized schematic representation in cross-section of an electronic device containing a crystallographically textured semiconductor device in accordance with the present invention. The device comprises a flexible, {110><100> textured Fe, Mo, Nb, Cr, or W-based, metal or alloy substrate; an optional, epitaxial buffer layer(s); an optional epitaxial semiconductor template layer(s) or an epitaxial graded semiconductor template layer(s); a crystallographically textured, epitaxial layer of Si and/or Ge; a crystallographically textured, epitaxial GaAs-type layer; a crystallographically textured, epitaxial InGaP-type layer; a transparent conductor layer, and optional antireflection coating and metal grid lines. The representation forms the general basis of a device. One can envisage additional semiconductor layers or junctions and/or buffer layers in this multilayered stack. One use of such a device is for solar power generation.

Example 1

Starting with a secondary recrystallized, Fe-3 at % Si substrate, with a {110}<100> orientation, a 10-75 nm thick, epitaxial layer of TiN is grown by electron beam evaporation, sputtering, pulsed laser ablation or chemical vapor deposition at a substrate temperature in the range of 300-850° C. This is followed by deposition of an epitaxial Si layer using chemical vapor deposition in the temperature range of 300-900° C.

Example 2

Starting with a secondary recrystallized, Fe-3 at % Si substrate, with a {110}<100> orientation, a 10-75 nm thick, epitaxial layer of TiN is grown by electron beam evaporation, sputtering, pulsed laser ablation or chemical vapor deposition at a substrate temperature in the range of 300-850° C. This is followed by deposition of a 10-75 nm thick, epitaxial, layer of MgO by electron beam evaporation, sputtering, pulsed laser ablation or chemical vapor deposition at a substrate temperature in the range of 300-850° C. This is followed by deposition of an epitaxial Si layer using chemical vapor deposition in the temperature range of 300-900° C.

Example 3

Starting with a secondary recrystallized, Fe-3 at % Si substrate, with a {110}<100> orientation, a 10-75 nm thick, epitaxial layer of $\gamma$-$Al_2O_3$ is grown by electron beam evaporation, sputtering, pulsed laser ablation or chemical vapor deposition at a substrate temperature in the range of 300-850° C. This is followed by deposition of an epitaxial Si layer using chemical vapor deposition in the temperature range of 300-900° C. Numerous reports exist in the literature of epitaxial growth of Si on $\gamma$-$Al_2O_3$ (see for example, Liwen tan, Qiyuan Wang, Jun Wang, Yuanhuan Yu, Zhongli Liu and Lanying Lin, "Fabrication of novel double-hetero-epitaxial SOI structure Si/$\gamma$-$Al_2O_3$/Si," Journal of Crystal Growth, vol. 247, pp. 255-260, 2003; K. Sawada, M. Ishida, T. Nakamura and N. Ohtake, "Metalorganic molecular beam epitaxy of films on Si at low growth temperatures," Appl. Phys. Lett., vol. 52, pp. 1672-1674, 1988; M. Shahjahan, Y. Koji, K. Sawada and M. Ishida, "Fabrication of resonance tunnel diode by gamma-Al2O3/Si multiple heterostructures," Japan. J. of Appl. Phys. Part 1, vol. 41 (4B), pp. 2602-2605, 2002).

Example 4

Starting with a secondary recrystallized, Fe-3 at % Si substrate, with a {110}<100> orientation, a 10-75 nm thick MgO or TiN layer is deposited epitaxially on the Fe-3 at % Si substrate using electron beam evaporation, sputtering, pulsed laser ablation or chemical vapor deposition at a substrate temperature in the range of 300-700° C. This is followed by deposition of a 10-75 nm thick, epitaxial layer of $\gamma$-$Al_2O_3$ by electron beam evaporation, sputtering, pulsed laser ablation or chemical vapor deposition at a substrate temperature in the range of 300-850° C. This is followed by deposition of an epitaxial Si layer using chemical vapor deposition in the temperature range of 300-900° C.

Example 5

Starting with a secondary recrystallized, Fe-3 at % Si substrate, with a {110}<100> orientation, a 10-75 nm thick TiN layer is deposited epitaxially on the Fe-3 at % Si substrate using electron beam evaporation, sputtering, pulsed laser ablation or chemical vapor deposition at a substrate temperature in the range of 300-700° C. This is followed by deposition of a 10-75 nm thick, epitaxial layer of YSZ by electron beam evaporation, sputtering, pulsed laser ablation or chemical vapor deposition at a substrate temperature in the range of 300-850° C. This is followed by deposition of a 10-75 nm thick, epitaxial layer of $\gamma$-$Al_2O_3$ by electron beam evaporation or sputtering or pulsed-laser deposition at a substrate temperature in the range of 300-850° C. This is followed by deposition of an epitaxial Si layer using chemical vapor deposition in the temperature range of 300-900° C.

Example 6

Starting with a secondary recrystallized, Fe-3 at % Si substrate, with a {110}<100> orientation, a 10-75 nm thick Mo or W layer is deposited epitaxially on the Fe-3 at % Si substrate using electron beam evaporation, sputtering, pulsed laser ablation or chemical vapor deposition at a substrate temperature in the range of 300-700° C. This is followed by deposition of an epitaxial Si, Ge or GaAs layer using chemical vapor deposition in the temperature range of 300-900° C.

Example 8

Starting with a secondary recrystallized, Fe-3 at % Si substrate, with a {110}<100> orientation, a 10-75 nm thick Mo or W layer is deposited epitaxially on the Fe-3 at % Si substrate using electron beam evaporation, sputtering, pulsed laser ablation or chemical vapor deposition at a substrate temperature in the range of 300-700° C. followed by deposition of a 10-75 nm thick TiN layer is deposited epitaxially on NiW substrate using electron beam evaporation, sputtering, pulsed laser ablation or chemical vapor deposition at a substrate temperature in the range of 300-700° C. This is followed by deposition of an epitaxial Si, Ge or GaAs layer using chemical vapor deposition in the temperature range of 300-900° C.

Example 9

Starting with a secondary recrystallized, Fe-3 at % Si substrate, with a {110}<100> orientation, a 10-75 nm thick Mo or W layer is deposited epitaxially on the Fe-3 at % Si substrate using electron beam evaporation, sputtering, pulsed laser ablation or chemical vapor deposition at a substrate temperature in the range of 300-700° C. followed by deposition of a 10-75 nm thick TiN layer is deposited epitaxially on NiW substrate using electron beam evaporation, sputtering, pulsed laser ablation or chemical vapor deposition at a substrate temperature in the range of 300-700° C. This is followed by deposition of a 10-75 nm thick, epitaxial layer of $\gamma$-$Al_2O_3$ by electron beam evaporation or sputtering or pulsed laser deposition at a substrate temperature in the range of 300-850° C. This is followed by deposition of an epitaxial Si, Ge or GaAs layer using chemical vapor deposition in the temperature range of 300-900° C.

Example 10

Starting with a secondary recrystallized, Fe-3 at % Si substrate, with a {110}<100> orientation, a 10-75 nm thick Mo or W layer is deposited epitaxially on the Fe-3 at % Si substrate using electron beam evaporation, sputtering, pulsed laser ablation or chemical vapor deposition at a substrate temperature in the range of 300-700° C. followed by a 10-75 nm thick TiN layer deposited epitaxially using electron beam evaporation, sputtering, pulsed laser ablation or chemical vapor deposition at a substrate temperature in the range of 300-700° C. This is followed by deposition of a 10-75 nm thick, epitaxial layer, of YSZ by electron beam evaporation, sputtering, pulsed laser ablation or chemical vapor deposition at a substrate temperature in the range of 300-850° C. This is followed by deposition of a 10-75 nm thick, epitaxial layer, of MgO by electron beam evaporation, sputtering, pulsed laser ablation or chemical vapor deposition at a substrate temperature in the range of 300-850° C. This is followed by deposition of a 10-75 nm thick, epitaxial layer of $\gamma$-$Al_2O_3$ by electron beam evaporation, sputtering, pulsed laser ablation or chemical vapor deposition at a substrate temperature in the range of 300-850° C. This is followed by deposition of an epitaxial Si layer using chemical vapor deposition in the temperature range of 300-900° C. This cubic oxide layer can also be graded oxide layer to provide a better lattice match to the epitaxial semiconductor layer.

Example 11

Starting with the experimental procedure of Examples 1-10, a Germanium (Ge) or a Si deposited upon the top buffer layer or the optional semiconductor template layer. This is followed by deposition of an epitaxial GaAs layer by chemical vapor deposition. This is then followed by deposition of an epitaxial InGaP layer. A transparent conductor is then deposited, followed by deposition of an antireflection coating and metal grid lines. The device shown schematically in FIG. 23 is now fabricated. The purpose to fabricate such a multifunction device has been discussed previously in FIGS. 10 and 11 and the goal is to increase the photovoltaic conversion efficiency by capturing a greater portion of the sun's spectrum. The substrate with the buffer layers and the optional textured semiconductor template layer can be prepared according to the teachings in Examples 1-10. During the fabrication of the device shown in this example, an untextured or textured reaction layer can form at the interface of the top buffer layer to form a nitride or an oxide with the semiconductor such as silicon nitride or silicon oxide layer.

Example 12

Starting with the experimental procedure of Example 1-10, a Germanium (Ge) layer is deposited upon the epitaxial Si layer. This is followed by deposition of an epitaxial GaAs layer by chemical vapor deposition. This is then followed by deposition of an epitaxial InGaP layer. A transparent conductor is then deposited, followed by deposition of an antireflection coating and metal grid lines.

Example 13

Starting with the teachings in Example 1-10, a heterostructure of is formed with a Si layer as the top surface. A graded semiconductor template layer of Si—Ge is then deposited upon the Si layer. There is a 4% lattice mismatch between silicon and germanium. This puts enormous stress on a Ge film if deposited directly by epitaxial deposition on the Si layer and can cause many crystalline defects to appear. Hence, as the Si—Ge layer grows, the content of germanium is gradually increased to more or less pure Ge. The Ge layer provides an excellent lattice match for growth of GaAs. The graded semiconductor template approach also reduces thermal expansion mismatch between the top semiconductor template layer and the semiconductor device layer.

Example 14

Starting with the teachings in Example 1-10, a heterostructure is formed on the Fe-3 at % W with TiN as the top surface. A compositionally graded nitride layer is then deposited to form a good lattice match in the top layer with Silicon. Si is then epitaxially deposited on the "graded buffer layer". A graded semiconductor template layer of Si—Ge is then deposited upon the Si layer. There is a 4% lattice mismatch between silicon and germanium. This puts enormous stress on a Ge film if deposited directly by epitaxial deposition on the Si layer and can cause many crystalline defects to appear. Hence, as the Si—Ge layer grows, the content of germanium is gradually increased to more or less pure Ge. The Ge layer provides an excellent lattice match for growth of GaAs. The graded semiconductor template approach also reduces thermal expansion mismatch between the top semiconductor template layer and the semiconductor device layer.

Example 15

Starting with a biaxially textured, Fe-3 at % Si substrate, a 10-75 nm thick TiN layer is deposited epitaxially using electron beam evaporation, sputtering or chemical vapor deposition at a substrate temperature in the range of 300-700° C. This is followed by deposition of a 10-75 nm thick, epitaxial layer of cubic SiC or $\beta$—SiC using chemical vapor deposition following the procedure of Jin-Hyo Boo, S. A. Ustin and W. Ho, "Supersonic jet epitaxy of single crystalline cubic SiC thin films on Si substrates from t-Butyldimethylsilane," Thin solid Films, vol. 324, pp. 124-128, 1998. This is followed by deposition of an epitaxial Si layer using chemical vapor deposition in the temperature range of 300-900° C.

While GaAs layers can be integrated with large area, flexible substrates as described previously, GaAs can also be grown directly on perovskite oxides such as $SrTiO_3$ (see for example, K. Eisenbeiser, R. Emrick, R. Droopad, Z. Yu, J. Finder, S. Rockwell, J. Holmes, C. Overgaard, and W. Ooms, "GaAs MESFETs Fabricated on Si Substrates Using a $SrTiO_3$ Buffer Layer," IEEE Electron Device Letters, Vol. 23, No. 6, pp. 300-302, 2002; Droopad R, Yu Z Y, Li H, Liang Y, Overgaard C, Demkov A, Zhang XD, Moore K, Eisenbeiser K, Hu M, Curless J, Finder J, "Development of integrated hetero structures on silicon by MBE," Journal of Crystal Growth, vol. 251 (1-4), pp. 638-644, 2003). In this work a compliant substrate for the epitaxial growth of compound semiconductors such as GaAs is reported. Perovskite-type buffer layers such as $SrTiO_3$ are first grown epitaxially on a Si single crystal wafer. After growth, a thin amorphous layer of $SiO_2$ about 20 angstroms in thickness is formed between the $SrTiO_3$ layer and the Si substrate. This thin amorphous layer acts as an elastic membrane mechanically decoupled from the Si substrate. If the $SrTiO_3$ layer is also kept thin to about 50 Angstroms, the final mismatch between the GaAs layer and Si is much lower than 4% if GaAs is grown directly on Si. This of course results in higher quality GaAs layer with fewer defects.

Example 16

Starting with a biaxially textured, Fe-3 at % Si substrate, a 10-75 nm thick γ-$Al_2O_3$ layer is deposited epitaxially using electron beam evaporation, sputtering or chemical vapor deposition at a substrate temperature in the range of 300-700° C. This was followed by epitaxial deposition of a 100 nm thick $SrTiO_3$ layer on the $Y_2O_3$ Layer using rf-sputtering at a substrate deposition temperature of 300-700° C. A GaAs layer is then deposited heteroepitaxially on the $SrTiO_3$ layer using molecular beam epitaxy (MBE) using the procedure outlined in K. Eisenbeiser, R. Emrick, R. Droopad, Z. Yu, J. Finder, S. Rockwell, J. Holmes, C. Overgaard, and W. Ooms, "GaAs MESFETs Fabricated on Si Substrates Using a $SrTiO_3$ Buffer Layer," IEEE Electron Device Letters, Vol. 23, No. 6, pp. 300-302, 2002 and in Droopad R, Yu Z Y, Li H, Liang Y, Overgaard C, Demkov A, Zhang X D, Moore K, Eisenbeiser K, Hu M, Curless J, Finder J, "Development of integrated hetero structures on silicon by MBE," Journal of Crystal Growth, vol. 251 (1-4), pp. 638-644, 2003.

Deposition of semiconductor layers can be done using a range of techniques. Many of these have recently been reviewed (see for example, Michelle J. McCann, Kylie R. Catchpole, Klaus J. Weber, Andrew W. Blakers, "A review of thin-film crystalline silicon for solar cell applications. Part 1: Native substrates," Solar Energy Materials and Solar Cells, Vol. 68, Issue 2, May 2001, Pages 135-171; Kylie R. Catchpole, Michelle J. McCann, Klaus J. Weber and Andrew W. Blakers, "A review of thin-film crystalline silicon for solar cell applications. Part 2: Foreign substrates," Solar Energy Materials and Solar Cells, Vol. 68, Issue 2, May 2001, Pages 173-215). In addition, there is interest in any low-temperature deposition technique as well since this will further reduce interdiffusion of elements from the metal/alloy substrate to the semiconductor device layer. Many low temperature deposition techniques for Si have been explored (see for example, Lars Oberbeck, Jan Schmidt, Thomas A. Wagner and Ralf B. Bergman, "High rate deposition of epitaxial layers for efficient low-temperature thin film epitaxial silicon solar cells," Progress in Photovoltaics: Research and Applications, vol. 9, pp. 333-340, 2001; J. Carabe and J. J. Gandia, "Thin-film-silicon Solar Cells," OPTO-Electronics Review, vol. 12, pp. 1-6, 2004; S Summers, H S Reehal and G H Shirkoohi, "The effects of varying plasma parameters on silicon thin film growth by ECR plasma CVD," J. Phys. D: Appl. Phys. Vol. 34, pp. 2782-2791, 2001; Thomas A. Wagner, Ph.D thesis, "Low temperature silicon epitaxy: Defects and electronic properties," Institut fur Physikalische Elektronik der Universit at Stuttgart, 2003; Hattangady, S. V., Posthill, J. B., Fountain, G. G., Rudder R. A., Mantini and M. J., Markunas, R. J., "Epitaxial silicon deposition at 300° C. with remote plasma processing using $SiH_4$/$H_2$ mixtures," Appl. Phys. Lett., vol. 59(3), pp. 339-341, 1991; Wagner, T. A., Oberbeck, L., and Bergmann, R. B., "Low temperature epitaxial silicon films deposited by ion-assisted deposition," Materials Science & Engineering B—Solid State Materials for Advanced Technology, vol. 89, pp. 1-3, 2002; Overbeck, L., Schmidt, J., Wagner, T. A., and Bergmann R. B., "High-rate deposition of epitaxial layers for efficient low-temperature thin film epitaxial silicon solar cells," Progress in Photovoltaics, vol. 9(5), pp. 333-340, 2001; Thiesen, J., Iwaniczko, E., Jones, K. M., Mahan, A., and Crandall, R., "Growth of epitaxial silicon at low temperatures using hot-wire chemical vapor deposition," Appl. Phys. Lett., vol. 75(7), pp. 992-994, 1999; Ohmi, T., Hashimoto, K., Morita, M., Shibata, T., "Study on further reducing the epitaxial silicon temperature down to 250° C. in low-energy bias sputtering," Journal of Appl. Phys., vol. 69(4), pp. 2062-2071, 1991).

With respect to low-temperature chemical vapor deposition (CVD) processes for deposition of the semiconductor layer, hot-wire CVD (Qi Wang, Charles W. Teplin, Paul Stradins, Bobby To, Kim M. Jones, and Howard M. Branz, "Significant improvement in silicon chemical vapor deposition epitaxy above the surface dehydrogenation temperature," J. of Appl. Phys., 100, 093520, 2006 and Charles W. Teplin, Qi Wang, Eugene Iwaniczko, Kim M. Jones, Mowafak Al-Jassim, Robert C. Reedy, Howard M. Branz, "Low-temperature silicon homoepitaxy by hot-wire chemical vapor deposition with a Ta filament," Journal of Crystal Growth 287 (2006) 414-418), plasma-assisted CVD ("Very Low Temperature Epitaxial Growth of Silicon Films for Solar Cells," Jap. J. of Appl. Phys. 46, 12, 7612-7618, 2007), ECR plasma CVD, mesoplasma CVD (Jose Mario A. Diaz, Munetaka Sawayanagi, Makoto Kambara, and Toyonobu Yoshida, "Electrical Properties of Thick Epitaxial Silicon Films Deposited at High Rates and Low Temperatures by Mesoplasma Chemical Vapor Deposition," Japanese Journal of Applied Physics, Vol. 46, No. 8A, 2007, pp. 5315-5317) and gas-jet plasma CVD (R. G. Sharafutdinov, V. M. Karsten, S. Ya. Khmel, A. G. Cherkov, A. K. Gutakovskii, L. D. Pokrovsky and O. I. Semenova, "Epitaxial silicon films deposited at high rates by gas-jet electron beam plasma CVD," Surface and Coatings Technology, Volumes 174-175, September-October 2003, Pages 1178-1181), electron-beam excited plasma CVD (Yagi, Y., Motegi, H., Ohshita, Y., Kojima, N., Yamaguchi, M., "High-speed growth of silicon thin films by EBEP-CVD using $Si_2H_6$," Photovoltaic Energy Conversion, 2003. Proceedings of 3rd World Conference on Volume 2, Issue, 12-16 May 2003 Page(s): 1667-1670 Vol. 2) are of interest.

Semiconductor layers can also be deposited using an ex-situ process. In this process, a precursor film of the semiconductor layer is first deposited followed by epitaxial crystallization of the semiconductor layer (see for example, International Patent Application No. WO 2004/033769 A1 titled "Fabrication method for crystalline semiconductor on foreign substrates"; Ngo Duong Sinh, Gudrun Andra, Fritz Falk, Ekkehart Ose, Joachim Bergmann, "Optimization of Layered Laser Crystallization for Thin-Film Crystalline Silicon Solar Cells," Solar Energy Materials & Solar Cells 74 (2002), 295-303; Nickel, N. H.; Brendel, K.; Saleh, R., "Laser crystallization of hydrogenated amorphous silicon," Physica status solidi. C. Conferences and critical reviews, vol. 1, no5, pp. 1154-1168, 2004; J. B. Boyce, J. P. Lu, J. Ho, R. A. Street, K. van Schuylenbergh and Y. Wang, "Pulsed laser crystallization of amorphous silicon for polysilicon flat panel imagers," Journal of Non-Crystalline Solids, Vol. 299-302, pp. 731-735, 2002; Lulli, G.; Merli, P. G.; Antisari, M. Vittori, "Solid-phase epitaxy of amorphous silicon induced by electron irradiation at room temperature," Physical Review B (Condensed Matter), Volume 36, Issue 15, Nov. 15, 1987, pp. 8038-8042; Mohadjeri, B.; Linnros, J.; Svensson, B. G.; Ostling, M., "Nickel-enhanced solid-phase epitaxial regrowth of amorphous silicon," Physical Review Letters, Volume 68, Issue 12, Mar. 23, 1992, pp. 1872-1875; Yann Civale, L is K. Nanver, Peter Hadley, Egbert J. G. Goudena, and Hugo Schellevis, "Sub-500° C. Solid-Phase Epitaxy of Ultra-Abrupt p+-Silicon Elevated Contacts and Diodes," IEEE Electron Device Letters, Vol. 27, 2006; Cline H. E., "A single crystal silicon thin-film formed by secondary recrystallization," Journal of Appl. Phys., vol. 55 (12), pp. 4392-

4397, 1984; Santos, P. V.; Trampert, A.; Dondeo, F.; Comedi, D.; Zhu, H. J.; Ploog, K. H.; Zanatta, A. R.; Chambouleyron, I. "Epitaxial pulsed laser crystallization of amorphous germanium on GaAs," Journal of Applied Physics, Vol. 90, pp. 2575-2581, 2001; T. Sameshima, H. Watakabe, H. Kanno, T. Sadoh and M. Miyao, "Pulsed laser crystallization of silicon-germanium films," Thin Solid Films Vol. 487 pp. 67-71, 2005; R. D. Ott, P. Kadolkar, C. A. Blue, A. C. Cole, and G. B. Thompson, "The Pulse Thermal Processing of Nanocrystalline Silicon Thin-Films," JOM, vol. 56, pp. 45-47, October, 2004).

Solar cells based on polycrystalline Cu(In, Ga)Se$_2$ (CIGS) thin films are also of significant interest and a record efficiency of 19.2% has been demonstrated in laboratory scale. Scale-up of this process on flexible substrates continues in the industry, however, efficiencies obtained in production runs are much lower. Even the high efficiency solar cells made using the CIGS thin films are polycrystalline with an average grain size of about 2 µm. So far not much is completely established about the exact effect or influence of grain boundaries in CIGS solar cells. It has been proposed that oxygen may be passivating the otherwise detrimental grain boundaries (see for example, D. Cahen and R. Noufi, "Defect chemical explanation for the effect of air anneal on CdS/CuInSe$_2$ solar cell performance," Appl. Phys. Lett., vol. 54, pp. 558-560, 1989). It has also been suggested that the diffusion of sodium (Na) to the grain boundaries catalyzes this beneficial oxygenation (see for example, L. Kronik, D. Cahen, and H. W. Schock, "Effects of Sodium on Polycrystalline Cu(In,Ga)Se$_2$ and Its Solar Cell Performance," Advanced Materials, vol. 10, pp. 31-36, 1999). It has also been demonstrated that recombination charge carriers at grain boundaries is different from that of the bulk (see for example, M. J. Romero, K. Ramanathan, M. A. Contreras, M. M. Al-Jassim, R. Noufi, and P. Sheldon, "Cathodoluminescence of Cu(In,Ga)Se$_2$ thin films used in high-efficiency solar cells," Appl. Phys. Lett., vol. 83, pp. 4770-4772, 2003). It has been suggested that intrinsic passivation occurs at grain boundaries because of a wider gap at grain boundaries (see for example, Persson C, Zunger A., "Anomalous grain boundary physics in polycrystalline CuInSe$_2$: the existence of a hole barrier," Phys. Rev. Lett. vol. 91, pp. 266401-266406, 2003). It has been suggested that the beneficial local built-in potential at grain boundaries is dependent on the Ga content (see for example, C.-S. Jiang, R. Noufi, K. Ramanathan, J. A. AbuShama, H. R. Moutinho, and M. M. Al-Jassim, "Local Built-in Potential on Grain Boundary of Cu(In,Ga)Se$_2$ Thin Films," Conference Paper, NREL/CP-520-36981, 2005). It has been reported that there is a reduction in the Cu content at the grain boundaries and that this leads to the less detrimental effect of grain boundaries (see for example, M. J. Hetzer, Y. M. Strzhemechny, M. Gao, M. A. Contreras, A. Zunger, and L. J. Brillson, "Direct observation of copper depletion and potential changes at copper indium gallium diselenide grain boundaries," Appl. Phys. Lett. vol. 86, pp. 162105-162107, 2005). It has also been suggested that the crystallographic texture is also important for the higher efficiency CIGS based solar cells (see for example, S. Chaisitsak, A. Yamada and M. Konagai, "Preferred Orientation Control of Cu(In1-xGax)Se$_2$ (x≈0.28) Thin Films and Its Influence on Solar Cell Characteristics," Jpn. J. Appl. Phys. vol. 41, pp. 507-513, 2002). Taken together, these above studies suggest that while grain boundaries may not be very detrimental in general in CIGS-based solar cells, it is important what the composition of the grain boundary is so as to control its electronic activity. This requires very good control of grain boundary structure which is not possible in randomly or weakly uniaxially textured CIGS films. If the orientation of all the CIGS grains were controlled by fabricating crystallographically textured cells, then in run after run, the composition of the CIGS film grain boundaries will be the same. This will allow one to fabricate large-area CIGS-based cells with very high efficiencies in industrial settings which is not possible presently.

FIG. 24 shows variations in the metal or alloy substrate that can be used with this invention. FIG. 24A shows an idealized schematic representation in cross-section of a composite substrate which contains a crystallographically untextured or unaligned bottom with a top surface which is crystallographically textured or aligned such that the all the grains in this layer are aligned in all directions within 10 degrees. FIG. 24B shows an idealized schematic representation in cross-section of a composite substrate which contains a crystallographically untextured or unaligned center with a top and bottom surface which is crystallographically textured or aligned such that all the grains in this layer are aligned in all directions within 10 degrees.

Other applications of flexible electronics or circuits related to this invention are as connectors in various applications where flexibility, space savings, or production constraints limit the serviceability of rigid circuit boards or hand wiring. Another common application of flex circuits is in computer keyboard manufacturing; most keyboards made today use flexible circuits for the switch matrix.

Fabrication of a device layer or film in an epitaxial manner on a substrate is commonly performed in the electronic industry for many applications such as those involving superconductors, semiconductors, magnetic materials and electro-optical materials. In many of these applications, the performance of device layer can be significantly improved or enhanced via incorporation of an ordered array of nanodots, nanorods or nanoparticles second phase material. In other cases, incorporation of an ordered array of nanodots, nanorods or nanoparticles second phase material, can result in new and novel properties not possible otherwise. Also, in many of these applications, large-area and long device layers are required. This can be accomplished by epitaxial growth of device layers containing ordered array of nanodots, nanorods or nanoparticles second phase material on biaxially textured substrates. For example, in the field of high temperature superconductors, metallic tapes can be used to form epitaxial superconducting layers having long (km) lengths, for applications such as for low-loss electrical power lines, by epitaxial growth on artificially fabricated, biaxially textured substrates. Artificially fabricated, crystallographically textured substrates can be fabricated using thermomechanical texturing, by ion-beam assisted deposition or by inclined substrate deposition (the patents incorporated by reference as specified before teach how to fabricate such substrates).

In a preferred embodiment of the invention, self-assembled nanodots of a second phase material are incorporated during growth of the device layer. This can be done using many in-situ deposition techniques wherein the deposition of the film is done at elevated temperatures. In-situ film deposition techniques include pulsed laser ablation (PLD), chemical vapor deposition (CVD), molecular chemical vapor deposition (MOCVD), direct current (DC) or radio-frequency (rf) sputtering, electron beam co-evaporation, thermal co-evaporation and pulsed electron deposition (PED).

The self-assembled nanodots and/or nanorods of second phase material form due to misfit strain between the second phase and the matrix film. When the lattice parameter of the growing epitaxial film is different from that of the second phase material, a lattice mismatch occurs resulting in misfit strains. Nanodots and/or nanorods self-assemble themselves to minimize the strain and hence the energy of the composite film. Specific deposition conditions used during film growth as well as the composition or volume fraction of second phase incorporated, control the size, shape and orientation of the nanodots and/or nanorods. It is preferred to have a lattice mismatch between the film matrix and the material comprising the nanodots and/or nanorods to be greater than 3%. At this lattice mismatch and beyond, significant strains result and result in well-defined ordering of nanodots and nanorods.

Figure 25:
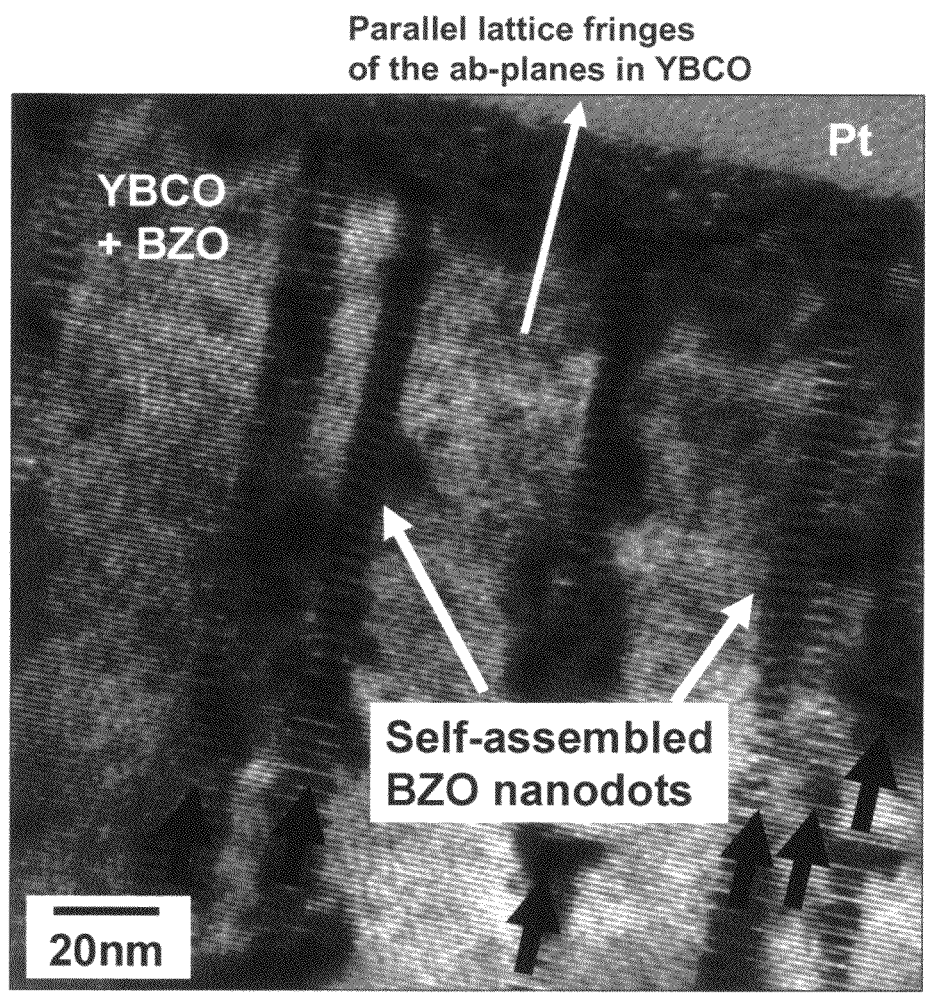
FIG. 25 shows a cross-section, transmission electron microscopy (TEM) image of a 0.2 μm thick, $YBa_2Cu_3O_x$ (YBCO) layer with self-assembled nanodots of BZO, grown epitaxially on a biaxially textured substrate with epitaxial buffers. Columns of self-assembled nanodots of $BaZrO_3$ (BZO) can be seen within the YBCO layer. The columns are perpendicular to the ab-planes of YBCO which are represented by the parallel lattice fringes in the YBCO layer, and are parallel to the c-axis of YBCO. Black arrows in the figure show the location of some of the columns of self-assembled nanodots of BZO.
Figure 26:
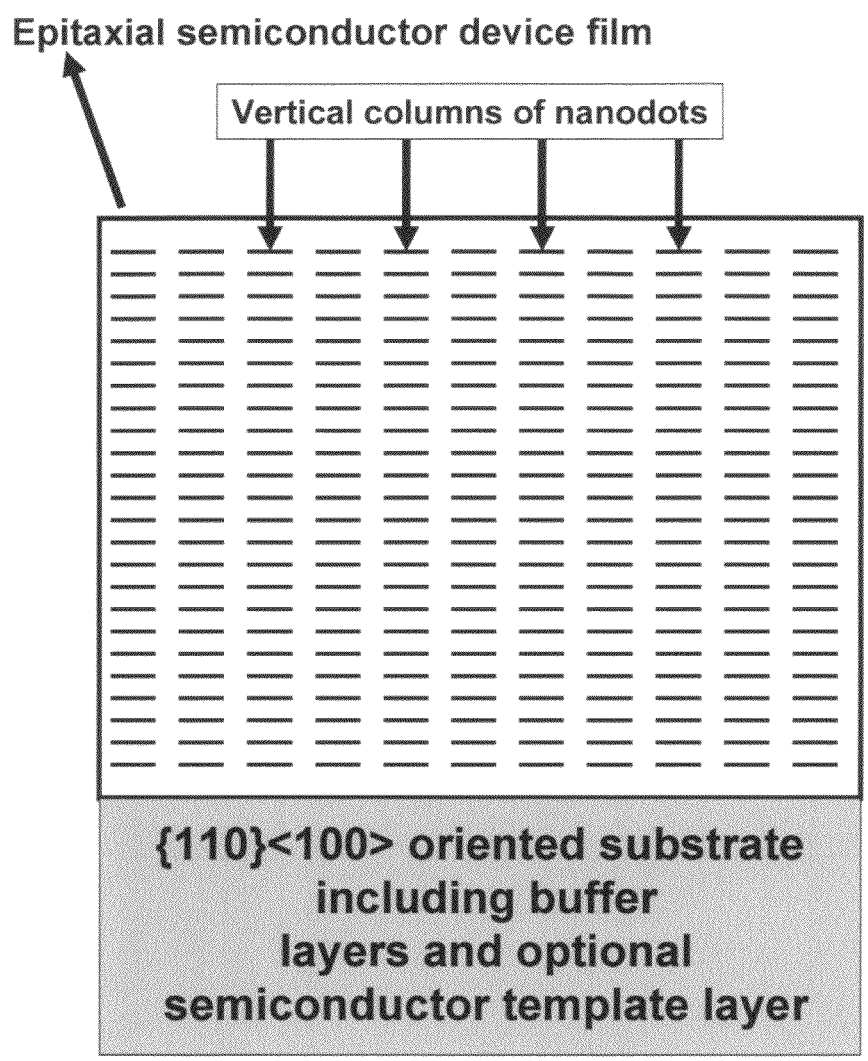
FIG. 26 shows an idealized schematic representation in cross-section of self-assembled or ordered nanodots within a device layer grown epitaxially on a substrate. In this case the ordering of nanodots occurs such that vertical columns of nanodots are formed.
Figure 27:
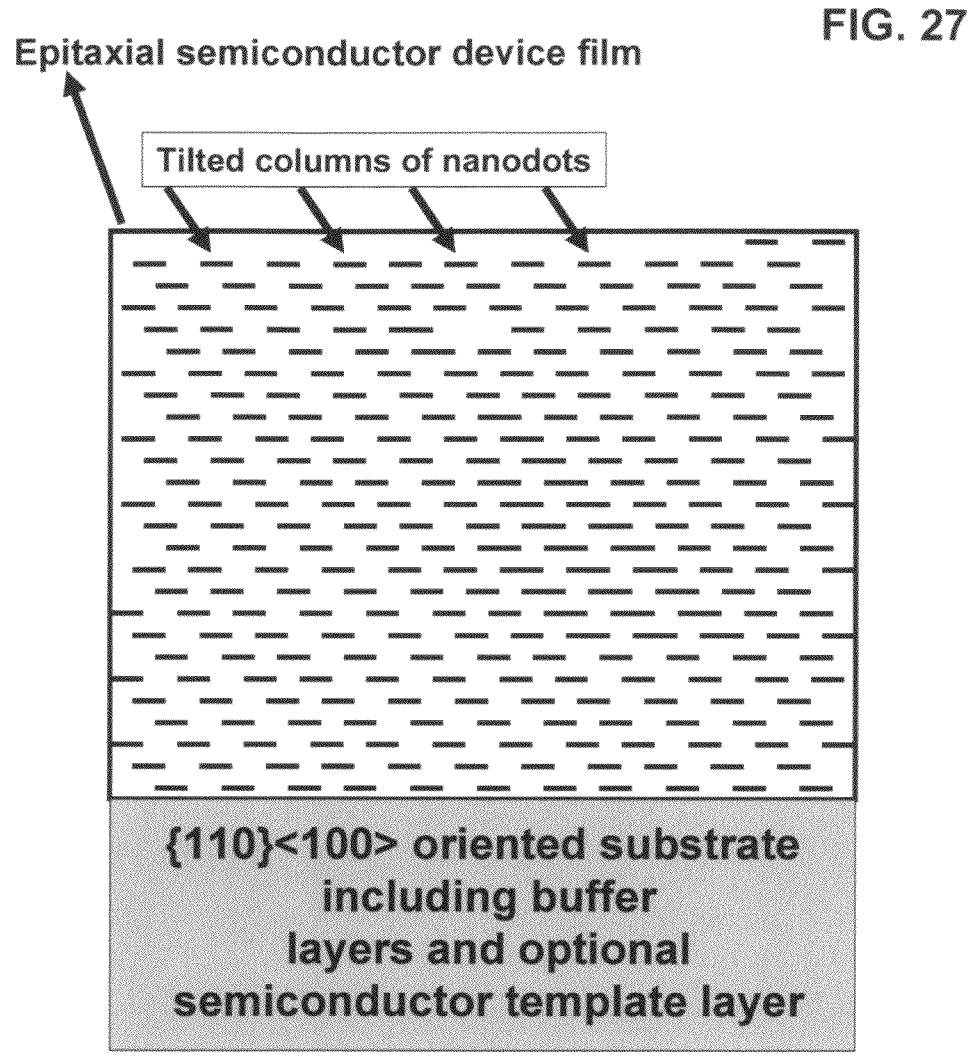
FIG. 27 shows an idealized schematic representation in cross-section of self-assembled or ordered nanodots within a device layer grown epitaxially on a substrate. In this case the ordering of nanodots can occur in a manner so as to form tilted columns of nanodots.
Figure 28:
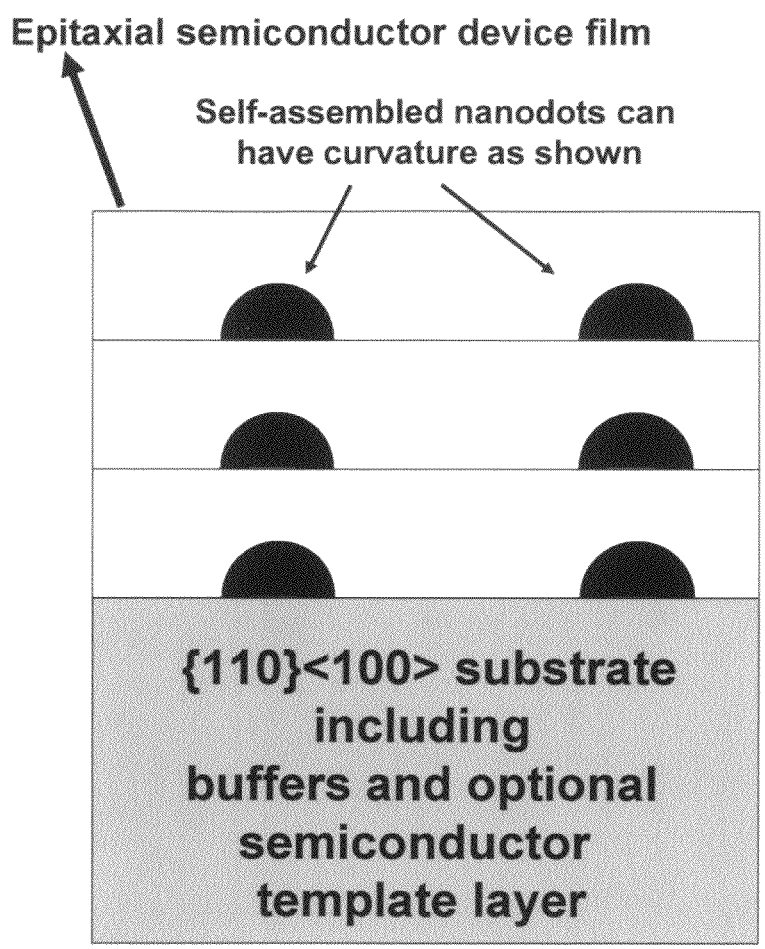
FIG. 28 shows an idealized schematic representation of self-assembled or ordered nanodots within a device layer grown epitaxially on a substrate. In this case the ordering of nanodots is vertical, however the nanodots have a curvature to them as shown.

Moreover, the ability to incorporate such self-assembled nanodots and/or nanorods of second phase material within a device layer while performing a single or simultaneous deposition is another important benefit of this invention. This significantly reduces the complexity of fabricating such novel device layers. Self-assembled nanodots and nanorods of non-superconducting phases were incorporated by performing laser ablation from a single target comprising a mixture of YBCO powder and nanoparticles of the chosen non-superconducting phase. Specific realization of this invention was demonstrated for a high temperature superconducting film of composition $YBa_2Cu_3O$ (YBCO) in which second phase nanodots and nanorods of composition $BaZrO_3$ (BZO) were incorporated during simultaneous deposition using PLD from a single target containing a mixture of YBCO and nanopowder of BZO. Nanoparticles of materials such as BZO, $CaZrO_3$ (CZO), YSZ, $Ba_xSr_{1-x}TiO_3$ (BST), etc. are commercially available from vendors such as Sigma-Aldrich. These nanoparticles, with a sharp particle size distribution ranging from 10-100 nm, are well-mixed with YBCO powder, via mechanical mixing, then cold pressed to form a green target. The target was then sintered at 950° C. in flowing oxygen. The target is then mounted on the target holder in the pulsed laser deposition (PLD) experimental setup. Depositions were performed on the technically important rolling-assisted-biaxially-textured-substrates (RABiTS) substrates with the configuration Ni-5 at % W (50 µm)/$Y_2O_3$ (75 nm)/YSZ (75 nm)/$CeO_2$ (75 nm). PLD depositions were performed using a XeCl (308 nm) excimer laser, LPX 305 at a repetition rate of 10 Hz, substrate deposition temperature of 790° C. and an oxygen partial pressure of 120 mTorr. The substrates were mounted on a heater block and the assembly was heated to a predetermined deposition temperature. The optimal temperature of film growth was determined by routine experimentation. The optimal distance between the target used for PLD and the substrate on which the film was deposited was also determined via routine experimentation. The background gas pressure used during the deposition so as to be in a regime wherein both the YBCO and BZO are stable was also determined by routine experimentation. FIG. 25 shows a cross-section, transmission electron microscopy (TEM) image of a 0.2 µm thick, $YBa_2Cu_3O$ (YBCO) layer with self-assembled nanodots of BZO, grown epitaxially on a biaxially textured substrate with epitaxial buffers. Columns of self-assembled nanodots of $BaZrO_3$ (BZO) can be seen within the YBCO layer. The columns are perpendicular to the ab-planes of YBCO which are represented by the parallel lattice fringes in the YBCO layer, and are parallel to the c-axis of YBCO. Black arrows in the figure show the location of some of the columns of self-assembled nanodots of BZO. FIG. 26 shows schematic of a cross-section of this desired structure in a more general manner. Shown in the figure is an epitaxial semiconductor device film on a crystallographically textured, polycrystalline, {110}<100> oriented substrate containing self-assembled nanodots of a second phase material. In this case, all the columns of self assembled nanodots are well aligned in a direction perpendicular to the substrate. FIG. 27 shows schematic of an epitaxial device film on a crystallographically textured, polycrystalline, {110}<100> oriented substrate with a semiconductor layer containing self-assembled nanodots of a second phase material wherein the columns of self assembled nanodots are well tilted with respect to the direction perpendicular to the substrate. FIG. 28 shows schematic of an epitaxial device film on a crystallographically textured, polycrystalline, {110}<100> oriented substrate of a semiconductor layer containing self-assembled nanodots of a second phase material wherein the self assembled nanodots are not flat but curved. Combination of the effects shown in FIGS. 26, 27 and 28 can also occur during film growth.

Since the present invention results in crystallographically textured or single-crystal-like devices, their performance is excellent. However, the present invention also results in cheaper devices. For example, in a typical production cost breakdown for crystalline silicon solar cell modules the slicing of the Si substrate, cell processing and module assembly accounts for 70% of the total cost of the module. Using the present invention to make solar cells, no slicing and module assembly is required. Module assembly involving assembling a number of processed Si wafers into a module, alone accounts for 35% of the total cost of the solar cell module. In the present invention, very large-area, textured solar cells can be fabricated using continuous or static processes. The device can then be patterned appropriately to delineate various cells in the large-area module.

The electronic device in accordance with this invention can be used for an application selected from a group comprising of photovoltaic devices, flat-panel displays, thermophotovoltaic devices, ferroelectric devices, light emitting diode devices, computer hard disc drive devices, magnetoresistance based devices, photoluminescence based devices, non-volatile memory devices, dielectric devices, thermoelectric devices and quantum dot laser devices. In a preferred embodiment, the electronic device has an area larger than 50 in². In yet a further preferred embodiment, the electronic device has an area larger than 113 in². Electronic devices in accordance with this invention can comprise at least one device component selected from a group comprising of two terminal devices such as a diode; three terminal devices such as a transistor, thyristor or rectifier; and multi-terminal devices such as a microprocessor, random access memory, read-only memory or a charge-coupled device.

It should be understood that the examples and embodiments described herein are for illustrative purposes only and that various modifications or changes in light thereof will be suggested to persons skilled in the art and are to be included within the spirit and purview of this application. The invention can take other specific forms without departing from the spirit or essential attributes thereof.

I claim:
1. A polycrystalline, electronic device comprising;
   a. a flexible, annealed, multigrain, metal or alloy substrate with a primary or secondary recrystallization texture corresponding to {110}<100>, with a mosaic or sharpness of texture of less than 10 degrees;
   b. at least one epitaxial, polycrystalline, semiconductor device layer on said substrate, with the semiconductor device layer having a crystallographic texture corresponding to a single orientation.

2. The article of claim 1 wherein said semiconductor device layer is a binary, ternary or a quarternary compound semiconductor composed of elements from two or more different groups of the Periodic Table.

3. The article of claim 1, wherein said semiconductor device layer corresponds to an elemental semiconductor or alloys of elements within the same group or a compound semiconductor comprising elements of group IB, IIIA and VIA of the periodic table.

4. The article of claim 1 wherein said substrate has an average grain size larger than 10 mm.

5. The article of claim 1 wherein the out-of-plane texture of said substrate is characterized by a mosaic or FWHM of less than 5°.

6. The article of claim 1 wherein said polycrystalline semiconductor device layer also has a crystallographic texture selected from a group consisting of a {110}<100>texture, a rotated {110}<100>texture with a rotation angle less than 90°, a {100}<100>texture and a rotated {100}<100>texture with a rotation angle less than 90°.

7. The article of claim 1, further comprising an epitaxial buffer layer on said substrate below the semiconductor device layer, selected from a group consisting of a metal, an alloy, a nitride, boride, oxide, fluoride, carbide, silicide, intermetallic alloy with germanium and combinations thereof.

8. The article of claim 7, wherein said epitaxial buffer layer has a crystallographic texture corresponding to {110}<100>or a rotated {110}<100>texture and with a mosaic or sharpness of texture of less than 10 degrees.

9. The article of claim 7 wherein said buffer layer has a crystal structure selected from a group consisting of rock-salt crystal structures of formula AN or AO, where A is a metal and N and O correspond to nitrogen and oxygen; perovskite crystal structures of formula $ABO_3$, where A and B are metals and O is oxygen; and pyrochlore crystal structures of formula $A_2B_2O_7$, where A and B are metals and O is oxygen and bixbyite crystal structures of formula $A_2O_3$, where A is a metal and O is oxygen.

10. The article of claim 7 wherein said buffer layer has a chemical formula selected from a group consisting of $A_{1-x}B_{1-x}O$ and $A_xB_{1-x}N$, where A and B are different metals; $A_xB_{1-x}N_yO_{1-y}$, where A and B are different metals; $(A_xB_{1-x})_2O_3$, where A and B are different metals; $(A_xA'_{1-x})(BO_3)$, $(A_xA'_{1-x})(B_yB'_{1-y})O_3$, where A, A', B and B' are different metals and mixed pyrochlores $(A_xA'_{1-x})_2B_2O_7$, $(A_xA'_{1-x})_2(B_yB'_{1-y})_2O_7$, where A, A', B and B' are different metals.

11. The article of claim 7 wherein said oxide buffer layer is selected from a group consisting of gamma $Al_2O_3$ (cubic form of $Al_2O_3$), $SrTiO_3$, $(Sr,Nb)TiO_3$, $BaTiO_3$, $(Ba,Ca)TiO_3$, $LaMnO_3$, $LaAlO_3$, $(La,Sr)MnO_3$, $(La,Ca)MnO_3$, $Bi_4Ti_3O_{12}$, $La_2Zr_2O_7$, $Ca_2Zr_2O_7$, $Gd_2Zr_2O_7$,—$Y_2O_3$, YSZ, MgO, and $MgAl_2O_4$.

12. The article of claim 7 wherein said silicide buffer layer or an intermetallic alloy with germanium corresponds to a layer with a chemical formula, MSi, $MSi_2$, $MSi_3$, MGe, $MGe_2$, $MGe_3$, wherein M is a metal selected from Ni, Cu, Fe, Ir, and Co and their alloys and mixtures thereof.

13. The article of claim 7 wherein said carbide buffer layer corresponds to the cubic form of SiC.

14. The article of claim 7 wherein said metal or alloy buffer layer is an epitaxial layer and is selected from a group consisting Mo, Cr, Nb, W, V, Ta, Ir and their alloys.

15. The article of claim 7 wherein said metal or alloy buffer layer has a crystal structure corresponding to body centered cubic (BCC).

16. The article of claim 7 wherein said buffer layer is a "compositionally graded buffer layer" comprising of multiple buffer layers with varying lattice parameters to provide a good lattice match to the semiconductor device layer.

17. The article of claim 7 wherein at least one buffer layer is electrically conducting.

18. The article of claim 1 further comprising a semiconductor template layer to provide a good lattice match to the semiconductor device layer.

19. The article of claim 18 wherein the semiconductor template layer is a "compositionally graded semiconductor template" layer with multiple layers of varying lattice parameters so as to provide a good lattice match to the semiconductor device layer.

20. The article of claim 1 wherein said substrate is selected from a group consisting of Fe, Mo, Cr, W, Nb and their alloys and mixtures thereof.

21. The article of claim 1 wherein said substrate comprises an iron-silicon alloy.

22. The article of claim 1 wherein said substrate comprises Fe-3%Si alloy.

23. The article of claim 1 wherein said substrate has a crystal structure corresponding to body centered cubic (BCC).

24. The article of claim 1 wherein said metal or alloy substrate is a multilayer composite substrate with only the top surface having a crystallographic texture corresponding to {110}<100>with a mosaic of less than 10°.

25. The article of claim 1 wherein said metal or alloy substrate is a multilayer composite substrate with the top and bottom surface having a crystallographic texture corresponding to {110}<100>with a mosaic of less than 10°.

26. The article of claim 1 wherein said electronic device is selected from a group consisting of photovoltaic devices, flat-panel displays, thermophotovoltaic devices ferroelectric devices, light emitting-diode devices, computer hard disc drive devices, magnetoresistance based devices, photoluminescence based devices, non-volatile memory devices, dielectric devices, thermoelectric devices and quantum dot laser devices.

27. The article of claim 1 wherein said electronic device comprises at least one device selected from a group consisting of two terminal devices, three terminal devices, and multi-terminal devices.

28. The article of claim 1 wherein said electronic device forms a component of a flat-panel active-matrix liquid crystal display (AMLCD) and a flat-panel active-matrix organic light-emitting diode (AMOLED) display.

29. The article of claim 1 wherein said electronic device is a photovoltaic device comprising at least one pn junction parallel to the substrate surface.

30. The article of claim 29 wherein the photovoltaic device comprises a multi-junction cell with at least two and preferably three pn junctions parallel to the substrate surface.

31. The article of claim 29 wherein the conversion efficiency of said device is greater than 13%.

32. The article of claim 1 wherein said electronic device consists of aligned nanodots of another crystalline composition than the semiconductor device layer, with the diameter of nanodots being in the range of 2-100 nanometers.

33. The article of claim 32 wherein 80% of the nanodots are aligned within 60 degrees from the normal to the semiconductor device layer.

34. The article of claim 1, wherein said semiconductor device layer is selected from the group consisting of Si, Ge, GaP, GaN, GaAs, CdTe, InP, InAs, InSb, ZnS, ZnSe, ZnTe, CdTe, HgTe, $Si_xGe_{1-x}$, CdHgTe, $CuInGaSe_2$ (CIGS), AlGaAs, GaInP, InGaN, AlInGaP, AlInP, $Zn_{1-y}Mn_yO_xTe_{1-x}$ and $GaN_xAs_{1-x-y}P_y$.

35. The article of claim 7 wherein said buffer layer has a crystal structure selected from the group consisting of flourite, perovskite, rock-salt, pyrochlore and spinel crystal structures.

36. The article of claim 7 wherein said buffer layer is selected from a group consisting of mixed rock-salt crystal structures, mixed oxynitrides, mixed bixbyite structures, mixed perovskites and mixed pyrochlores.

37. The article of claim 1 wherein the grain size distribution and grain structure or grain morphologies in said polycrystalline metal or alloy substrate are substantially replicated in the polycrystalline buffer layer.

38. The article of claim 1 wherein the grain size distribution and grain structure or grain morphologies in said polycrystalline metal or alloy substrate are substantially replicated in the polycrystalline semiconductor device layer.

* * * * *